(12) United States Patent
Wirtz et al.

(10) Patent No.: US 8,455,864 B2
(45) Date of Patent: Jun. 4, 2013

(54) HYBRID SEMICONDUCTOR ELECTRONIC DEVICE HAVING MULTIPLE MATERIAL LAYERS

(75) Inventors: Rene Wirtz, Stuttgart (DE); Silvia Rosselli, Mannheim (DE); Gabriele Nelles, Stuttgart (DE); Nikolaus Knorr, Stuttgart (DE); Zoi Karipidou, Stuttgart (DE); Ameneh Bamedi Zilai, Stuttgart (DE)

(73) Assignee: Sony Corporation, Tokyo (JP)

( * ) Notice: Subject to any disclaimer, the term of this patent is extended or adjusted under 35 U.S.C. 154(b) by 54 days.

(21) Appl. No.: 12/939,519

(22) Filed: Nov. 4, 2010

(65) Prior Publication Data

US 2011/0108816 A1    May 12, 2011

(30) Foreign Application Priority Data

Nov. 12, 2009   (EP) .................................... 09175838

(51) Int. Cl.
*H01L 51/05* (2006.01)

(52) U.S. Cl.
USPC .......................................................... 257/40

(58) Field of Classification Search
None
See application file for complete search history.

(56) References Cited

U.S. PATENT DOCUMENTS

| | | | |
|---|---|---|---|
| 6,740,900 B2 * | 5/2004 | Hirai | 257/40 |
| 2004/0129937 A1 * | 7/2004 | Hirai | 257/40 |
| 2007/0221958 A1 * | 9/2007 | Aoki | 257/211 |

OTHER PUBLICATIONS

U.S. Appl. No. 13/116,690, filed May 26, 2011, Wirtz, et al.
U.S. Appl. No. 12/672,238, filed Feb. 4, 2010, Rosselli, et al.
U.S. Appl. No. 12/907,455, filed Oct. 19, 2010, Wirtz, et al.
U.S. Appl. No. 13/056,508, filed Jan. 28, 2011, Wirtz, et al.

* cited by examiner

*Primary Examiner* — Scott B Geyer
(74) *Attorney, Agent, or Firm* — Oblon, Spivak, McClelland, Maier & Neustadt, L.L.P.

(57) ABSTRACT

Method of manufacture of an electronic device, comprising providing a substrate comprising a semiconductor device stack, depositing a first material layer over the substrate, the first material layer being an insulating layer, depositing an active organic material layer over the first material layer, depositing a second material layer over the active organic material layer, the second material layer being an insulating layer.

20 Claims, 12 Drawing Sheets

HYBRID SEMICONDUCTOR ELECTRONIC DEVICE HAVING MULTIPLE MATERIAL LAYERS

Figure 1A:
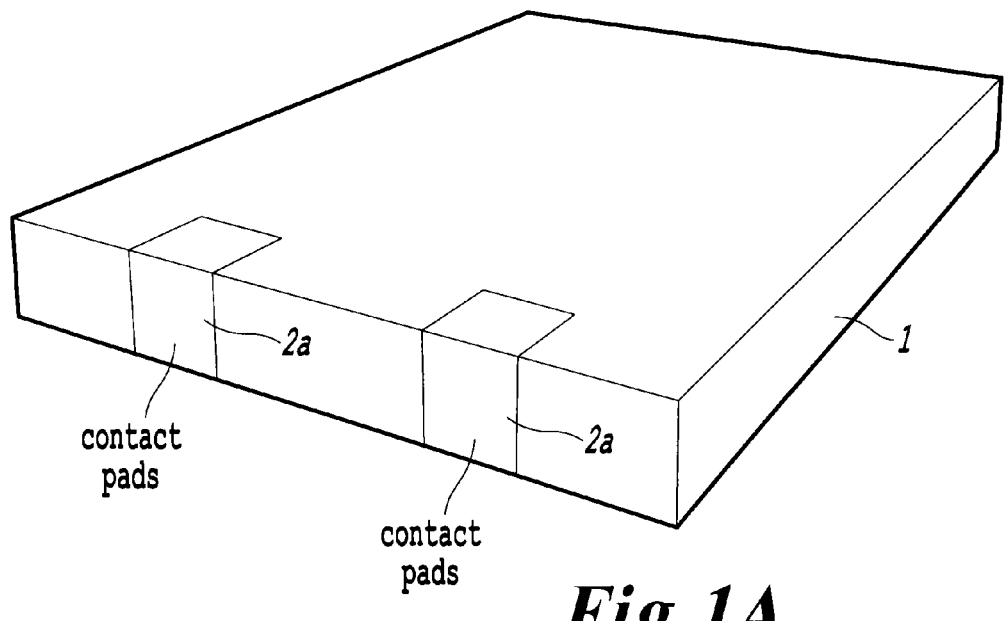

The invention refers to electronic devices and in particular to electronic hybrid devices consisting of a semiconductor device and a resistor switch and a corresponding method of manufacture.

In semiconductor technology complementary metal oxide semiconductor (CMOS) devices are very successful. A CMOS device is realized by a p-type and an n-type MOSFET. They dissipate less power than NMOS logic circuits because power is dissipated only when a switching of the device is done. Furthermore, CMOS circuits can be realized with a higher density on a substrate than other alternative circuits and CMOS semiconductor fabrication processes have a high flexibility and fabrication yield.

Several concepts of integrating molecular electronic devices that are usable for example as resistive switches with standard semiconductor circuits have been proposed.

A concept of re-configurable devices combining CMOS-circuits with a molecular cross-bar was presented in the year 2005 by Likharev [1; 2]. In this concept a CMOS circuit is combined with a molecular crossbar (CMOL). The CMOS layer consists of many inverters that are connected by small pins to a molecular cross-bar, which is deposited on top of the silicon wafer. The molecular layer in the cross-bar has the functionality of a switch, i.e. at each crossing point of a top and bottom electrode, the conduction state of the molecular layer can be switched between a conducting and an insulating state. By differently switching at different junctions in the cross-bar circuits with different functionalities can be implemented.

In 2007 a new concept to combine CMOS-circuits with a cross-bar of resistively switching elements was published by Hewlett-Packard [3]. This concept is based on the CMOL concept of Likharev et al. As in the CMOL concept, a cross-bar of resistively switching elements is deposited on top of a CMOS wafer. The CMOS layer consists not only of inverters but of complete logical functions, e.g. NAND, NOR or buffer cells. The cross-bar on top of the CMOS layer connects the different base cells in the silicon wafer, while the logic functionality is computed in the CMOS layer.

US 2008/0089120 A1 discloses a resistive memory having an amorphous solid electrolyte layer and a method of operating the memory. The resistive memory includes a switching device and a storage node connected to the switching device. The storage node includes a lower electrode, an upper electrode crossing the lower electrode and an amorphous solid electrolyte layer between the upper electrode and the lower electrode. The memory may be processed by a CMOS process.

WO 2008/121676 A1 discloses a hybrid CMOL structure including a first substrate having a CMOS device layer on the substrate, a first interconnect layer with interface pins over the CMOS device layer of the first substrate, a first array of nanowires connected to the interface pins of the first interconnect layer, a layer of nanowire junction material over the first array of nanowires, a second array of nanowires over the nanowire junction material, a second interconnect layer having interface pins disposed over the second array of nanowires, the interface pins being connected to the second array of nanowires, and a second substrate, the second substrate including a second CMOS device layer disposed over the second interconnect layer. The nanowire junction material can comprise for example a layer of electrical bistable molecules disposed between the nanowire arrays.

US 2005/0017759 A1 discloses a circuit element having a first layer composed of an electrically insulating substrate material, a first electrically conductive material which is in a form of at least one discrete area, such that it is embedded in or applied to the substrate material, a second layer having a second electrically conductive material, and a monomolecular layer, which is composed of electrically active molecules which transports charge carriers, arranged between the first layer and the second layer. The monomolecular layer is immobilized and makes electrical contact with the second layer. Each of the electrically active molecules has a first unit, which is used as an electron donor, a second unit, which is used as an electron acceptor, wherein the electron donor and the electron acceptor form a diode, and at least one redox-active unit, by means of which a variable resistance is formed, arranged between the first unit and the second unit.

US 2006/0211257 A1 relates to a compound comprising at least one memory unit consisting of an organic memory material, especially for use in CMOS structures, said compound being characterized by a) at least one first anchor group provided with a reactive group for covalently bonding to a first electrode, especially a bottom electrode of a memory cell and at least one second anchor group provided with a reactive group for boding to a second electrode, especially a top electrode of a memory cell.

JP 2007 220768 A1 discloses a process compatible with a semiconductor process to form a lower electrode and an upper electrode in a contact hole respectively, through interlayer insulation films, and a variable resistive film is sandwiched between both electrodes, thereby forming a memory part. The memory is surrounded by the interlayer insulation films with a low dielectric constant. Further, a cross-point non-volatile memory element is suitable for integration and speed up as it is compatible with a CMOS process or the like owing to its element structure.

All approaches of integrating resistive switches based on molecular materials and semiconductor devices have shown difficulties in their fabrication process. In particular, it appeared to be difficult to fabricate such a hybrid device entirely on the basis of a CMOS fabrication process. Moreover, hybrid electronic devices comprising a resistive switch based on an organic material are problematic as regards the durability of the completed device and with respect to a risk of damages to the organic material during the fabrication of the device. Organic materials are sensitive and can be damaged during common CMOS processing steps after their deposition. Furthermore, organic materials are subject to structural changes after their deposition on a substrate due to diffusion of the organic material into adjacent material layers or due to diffusion of materials from adjacent material layers into the organic material.

It is the object of the present invention to provide a method of manufacture of an electronic hybrid device comprising a semiconductor device and a resistive switch based on an active organic material that can be fully integrated into a MOS semiconductor fabrication process such as a CMOS technology avoiding damages to the active organic material during the fabrication process and resulting in a hybrid electronic device having a long durability and a corresponding device.

This problem is solved by a method comprising the features of new independent claim 1. According to the invention a method of manufacturing an electronic device is provided including providing a substrate comprising a semiconductor device stack, depositing a first material layer over the substrate, the first material layer being an insulating layer, depositing an active organic material layer over the first material layer, and depositing a second material layer over the active organic material layer, the second material layer being an insulating layer.

The method of manufacture according to the present invention permits to manufacture an electronic hybrid device comprising a semiconductor device stack and a resistive switch comprising an active organic material. The first material layer and the second material layer serve as insulating barrier layers preventing a diffusion of material from the adjacent layers such as the layers of the semiconductor device stack into the active organic material layer or a diffusion of active organic material into the adjacent material layers. In addition, the second material layer may serve as an insulating barrier layer preventing a diffusion of active organic material into adjacent material layers and protecting the active organic material layer against detrimental influences of adjacent material layers and subsequent processing steps. Due to the first material layer and the second material layer sandwiching the active organic material layer as insulating barrier layers the durability of the active organic material and the resistive switch can be increased. The method according to the invention can be performed by the use of conventional semiconductor processing techniques such as semiconductor lithography and CMOS processing.

According to an embodiment the method includes patterning the first material layer and forming a bottom electrode for contacting the active organic material layer using the first material layer as a mask. In particular, the bottom electrode can be formed by semiconductor lithographic processes including etching to pattern the first material layer to obtain one or several contact holes and by depositing a suitable conductor material such as Al, Cu, Ag, Pt, Au, Ni, Ti, Cr, PANI, Baytron P, without being restricted thereto, in the contact holes. In the same way one or several additional contacts for contacting the underlying semiconductor device stack can be prepared. Furthermore, the bottom electrode can be provided to contact both the semiconductor device stack and the active organic material layer.

According to another embodiment of the invention, the method includes patterning the second material layer and forming a top electrode for contacting the active organic material layer using the second material layer as a mask. Similar as for the bottom electrode standard semiconductor lithography processes including etching may be used to form a top electrode for contacting the active organic material layer.

By forming a bottom electrode and a top electrode sandwiching the active organic material layer a complete resistive switch is prepared. The first material layer and the second material layer sandwich the active organic material layer and encapsulate and protect it against the environment such as adjacent material layers and subsequent processing steps of the substrate. Materials that are suitable for the first material layer and the second material layer are dielectric materials such as silicon oxynitride (such as $SiO_xN_y$) and $Si_3N_4$ or other materials that are suitable for a use as a hard mask.

According to yet another embodiment the method includes depositing a third material layer between the second material layer and the active organic material layer. Subsequently, the third material layer can be patterned simultaneously with the second material layer in order to form contact holes. Subsequently, a top electrode for contacting the active organic material layer using the second material layer and the third material layer as a double layer mask can be formed. Hence, the third material layer may serve as another insulating barrier layer.

Preferably, the material of the third layer is a dielectric material of one of SiO and $SiO_2$ and other oxides (e.g. $Gd_2O_3$, $Y_2O_3$, $Al_2O_3$, $BaSrTiO_3$, $BaTiO_3$) or fluorides ($CaF_2$, LiF). Preferably, the third material layer is deposited with a deposition process without using a plasma such as an evaporation process or an electrochemical deposition process. Hence, detrimental effects of a plasma on the active organic material layer during a deposition process can be avoided. Furthermore, the third material layer protects the active organic layer during a subsequent plasma deposition process such as sputtering or PECVD etc. which are commonly used in a CMOS process for depositing of hard masks and have proven to be highly accurate and cost-efficient.

According to another embodiment the method includes patterning the second material layer and the third material layer including etching the second material layer and the third material layer, wherein the second material layer and the third material layer have different etch rates. Suitable etching processes include wet etching and plasma etching. Hence, the second material layer and the third material layer form a double-layer mask that comprises contact holes into which electrode materials such as Au, Ni, Pt, Cu, Al, Ag, Cr, Ti, PANI and Baytron P, without being restricted thereto, can be deposited, to contact the active organic material of the resistive switch. Using material having different etch rates and different sensitivities to specific chemical etch agents one of the second and third material layer can be used as a stop etch barrier. Preferably, the second material layer that is provided immediately on top of the active organic material layer is used as the stop etch layer and has a lower etch rate than the third material layer and a higher etch rate than the active material.

According to yet another embodiment depositing of the second material layer is performed with a deposition process without using a plasma such as evaporation or an electrochemical deposition, while the third material layer is deposited with a plasma deposition process such as sputtering or PECVD.

According to yet another embodiment the method includes depositing a horizontally extending metal bar in connection with one of the bottom electrodes and the top electrode. Accordingly, a cross-bar geometry of electrodes can be manufactured including one or several first bars contacting the bottom electrodes of several resistive switches and corresponding bars extending under an non-zero angle such as 90 degrees with respect to the first bars that are connected to top electrodes of several resistive switches.

According to the invention an electronic device is provided which includes a substrate with a semiconductor device stack, a first material layer over the substrate, the first material layer being an insulating layer, an active organic material layer over the first material layer, and a second material layer over the active organic material layer, the second material layer being an insulating layer as well.

The electronic device according to the invention is a hybrid electronic device integrating a semiconductor device stack and a resistive switch comprising an active organic material layer. The first material layer and the second material layer serve as insulating barrier layers preventing a diffusion of material from the adjacent layers such as the layers of the semiconductor device stack into the active organic material layer or a diffusion of active organic material into the adjacent material layers. In addition, the second material layer may serve as an insulating barrier layer preventing a diffusion of active organic material into adjacent material layers and protecting the active organic material layer against detrimental influences of adjacent material layers and subsequent processing steps. Due to the first material layer and the second material layer sandwiching the active organic material layer as insulating barrier layers the durability of the active organic material and the resistive switch can be increased. The electronic device according to the invention can be fabricated by conventional semiconductor processing techniques such as semiconductor lithography and CMOS processing.

According to one embodiment the first material layer comprises at least one bottom electrode for contacting the active organic material layer and the second material layer comprises at least one top electrode for contacting the active organic material layer. Accordingly, a complete resistive switch is provided, wherein the active organic material layer is sandwiched between a first material layer and a second material layer and encapsulated and protected by these layers.

According to another embodiment the device comprises a horizontally extending metal bar connected to one of the bottom electrodes and the top electrode. Preferably, the metal bar extends on and is deposited on the first material layer. The metal bar may form a cross-bar structure together with a second metal bar provided on top of the second material layer at a non-zero angle such as 90 degrees with respect to the first metal bar. Hence, a field-programmable gate array (FPGA) may be formed by providing several semiconductor stacks and resistive switches on a substrate connected by one or several metal bars in cross-bar arrangement.

According to yet another embodiment the semiconductor device stack comprises a CMOS transistor comprising a PMOS transistor and a NMOS transistor. Hence, the hybrid electronic device according to the invention can be produced by a space saving CMOS process.

According to yet another embodiment the material of one of the first material layer and the second material layer or of both is a dielectric material of one of silicon oxynitride ($SiO_xN_y$) and $Si_3N_4$ or any other dielectric material that is suitable for a use as a hard mask. Hence, the first material layer and the second material layer can be used as hard masks for forming one or several bottom and top electrodes, respectively.

According to still another embodiment the material of the third material layer is a dielectric material of one of SiO and $SiO_2$ and other oxides (e.g. $Gd_2O_3$, $Y_2O_3$, $Al_2O_3$, $BaSrTiO_3$, Ba—$TiO_3$) or fluorides ($CaF_2$, LiF).

According to an embodiment the substrate comprises a semiconductor stack that can generally comprise multiple strained or unstrained layers of a semiconductor, dielectric or metallic material or combinations thereof that can function as transistors, diodes, capacitors or can have any other electronic functionality.

According to a further embodiment the active organic layer can be one of an organic semiconductor, a semiconductor p-n junction, a resistively switching material, or a conductive polymer or can be a combination thereof and has a corresponding functionality. The active organic layer can also include several layers.

According to another embodiment the active organic layer consists of a molecular layer or of a metal-insulator-metal (MIM) junction and forms a resistive switch that exhibits resistive switching. The resistive switch may be formed by a metal-polymer-metal system wherein the polymer comprises semiconductive characteristics. Furthermore, the material may show the so called "filament switch effect".

According to a further embodiment organic semiconductor materials for a use in the MIM system can be polymers of the group including poly(acetylene)s, poly(pyrrole)s, poly(3-alkylthiophenes)s, polyanilines, polythiophenes, poly(p-phenylene sulfide), and poly(para-phenylene vinylene)s (PPV), polyindole, polypyrene, polycarbazole, polyazulene, polyazepine, poly(fluorene)s, and polynaphthalene without being restricted thereto. P-type organic semiconductors are for example molecules like pentacene, tetraceno[2,3-b] thiophene, TIPS-pentacene, α-sexithiophene, oligothiophene-fluorene derivative, Bis(ethylenedithio)tetrathiafulvalene, (BEDT-TTF), Bis(4,5-dihydronaphtho [1,2-d]) tetrathiafulvalene, Copper (II) phthalocyanine, Platinum octaethylporphyrin only to cite a few without being restricted thereto. n-type organic semiconductor are molecules like Fullerene-C60, Fullerene-C70, Fullerene-C84, Hexadecafluoro copper phthalocyanine, Pd(II) meso-Tetra (pentafluorophenyl)porphine, 1,4,5,8-Naphthalenetetracarboxylic dianhydride, Perylene-3,4,9,10-tetracarboxylic dianhydride, N,N'-Dipentyl-3,4,9,10-perylenedicarboximide, N,N'-Dioctyl-3,4,9,10-perylenedicarboximide (PTCDI-C8), N,N'-Diphenyl-3,4,9,10-perylenedicarboximide (PDCDI-Ph), 7,7,8,8-tetracyanoquinodimethane (TCNQ), 2,3,5,6-Tetrafluoro-7,7,8,8-tetracyanoquinodimethane (F4TCNQ) without being restricted thereto.

According to yet another embodiment a further group of suitable polymers includes for example poly(3-hexylthiophene) (P3HT), polyaniline, poly(phenylene vinylene)-disperse red 1(PPV-DR1), polysiloxane carbazole (PSX-Cz), polypyrrole, poly(o-anthranilic acid) (PARA) and poly (aniline-co-o-anthranilic acid) (PANI-PARA). The polymer is contacted by at least one metal having a high ion mobility like Cu, Au, Ag etc.

The structural formulas of the above mentioned polymers are shown below:

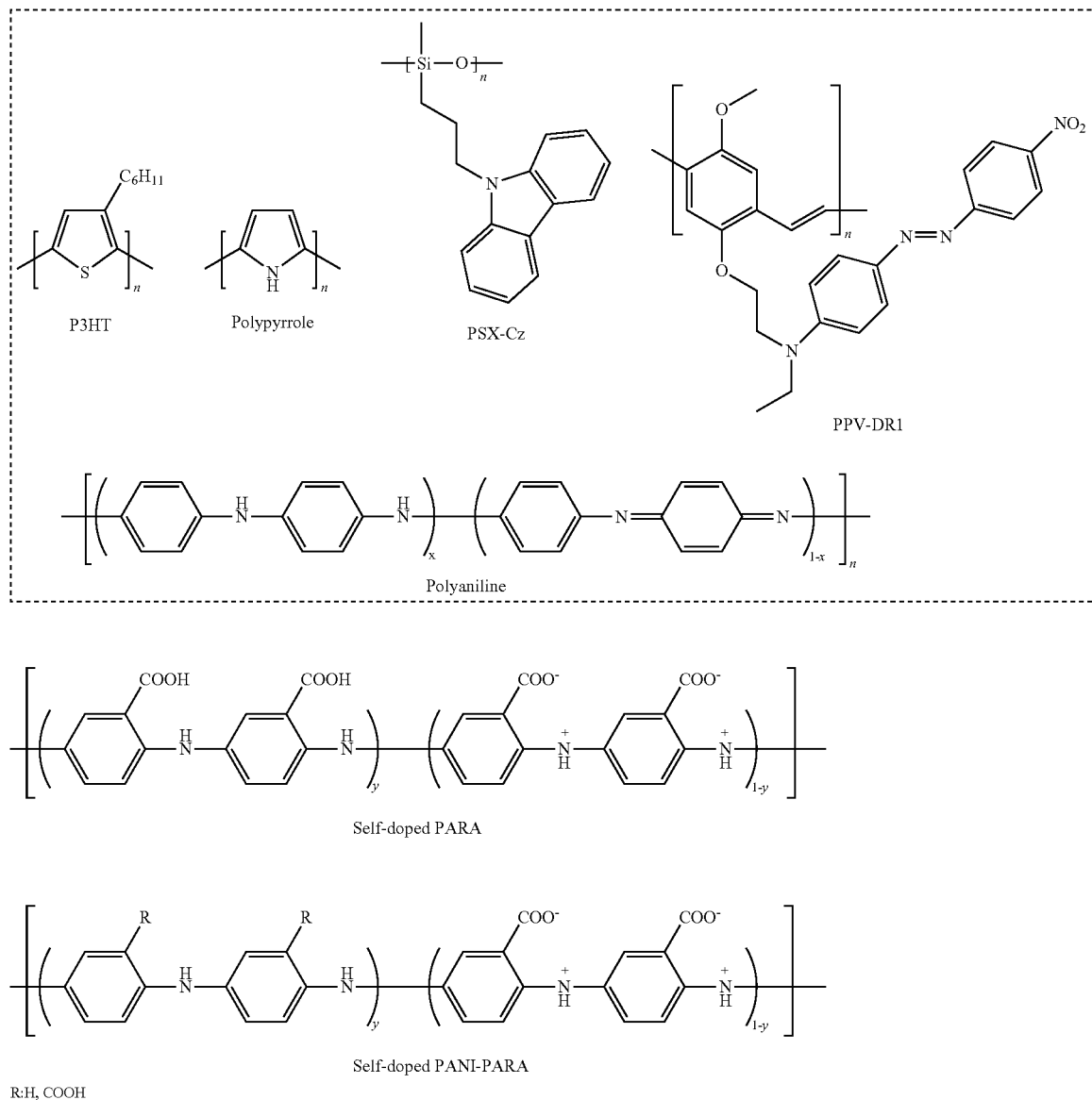

R:H, COOH

According to another embodiment suitable materials for the active organic layer can also include or consist of materials that exhibit a change of conductivity upon application of an electrical field such as a resistively switching material. Resistively switching materials can be materials that include components that undergo a charge transfer in response to an application of an electric field. This category of materials also includes resistively switching materials that undergo a charge transfer with a connected electrode in response to an application of an electric field. Suitable materials for the electrode include metals like Cu, Au, Ag etc.

Generally, these materials referred to as charge-transfer complexes are charge-donor-charge-acceptor complexes that are characterized by at least one electronic transition to an excited state in which there is a partial transfer of an electronic charge from the donor to the acceptor moiety. A charge can be an electron or a hole.

Donor and acceptor molecules in the charge transfer complex are so defined that the highest occupied molecule orbital (HOMO) of the donor and the lowest unoccupied molecule orbital (LUMO) of the acceptor are close enough with each other that upon application of an electric field a charge of the HOMO of the donor can transfer to the LUMO of the acceptor and vice versa depending on the electric field direction.

Donor molecules are molecules that donate charges during the formation of the charge transfer complex.

Donor molecules can include one or more of the following donor groups without being restricted thereto: $O^-$, $S^-$, $NR_2$, $NAr_2$, $NRH$, $NH_2$, $NHCOR$, $OR$, $OH$, $OCOR$, $SR$, $SH$, $Br$, $I$, $Cl$, $F$, $R$, $Ar$. They can be single molecules, oligomers or polymers.

According to yet another embodiment the resistively switching material of the active organic layer comprises a donor molecule of one of the following formulas without being restricted thereto:

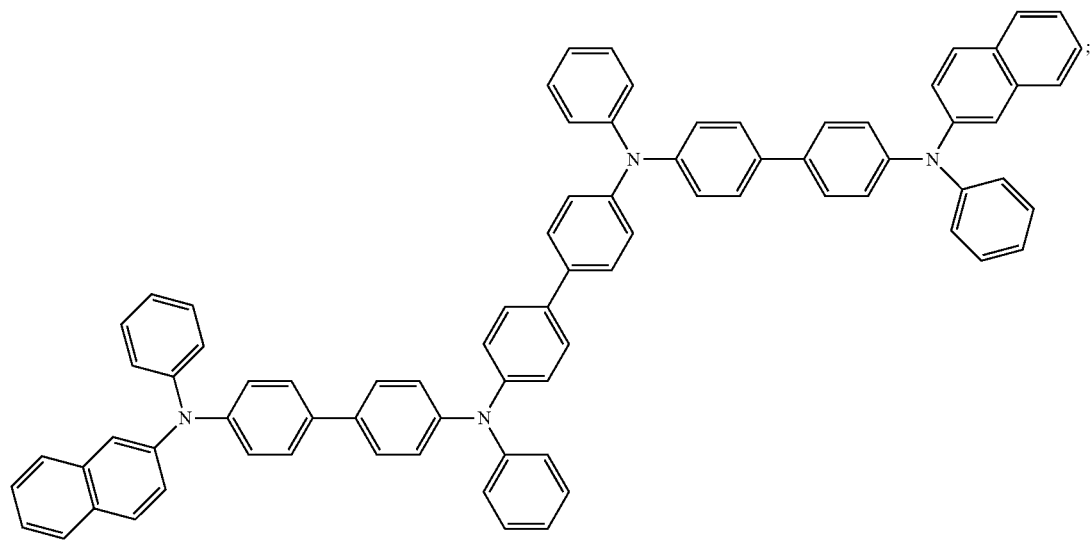

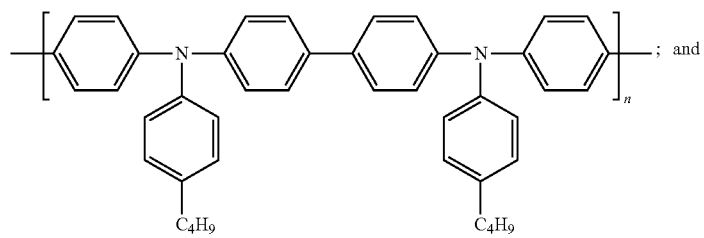; and

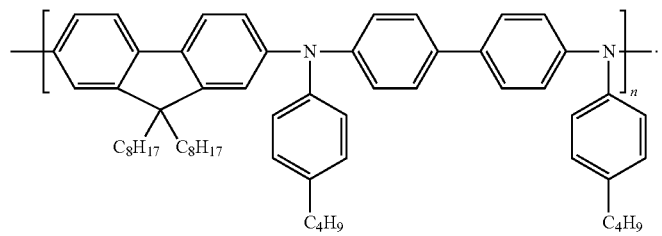

Acceptor molecules are molecules that accept charges during the formation of a charge transfer complex.

Acceptor molecules can contain one or more of the following acceptor groups without being restricted thereto: $NO_2$, CN, COOH, COOR, $CONH_2$, CONHR, $CONR_2$, CHO, COR, $SO_2R$, $SO_2OR$, NO, Ar. They can be single molecules, oligomers or polymers.

Acceptor molecules are found also among the fullerene derivatives, semiconductor nanodots and electron poor transition metal complexes.

According to another embodiment the resistively switching material comprises an acceptor molecule of the group comprising C60 fullerene, C61 fullerene, CdSe, and platinum octaethyl porphine.

According to yet another embodiment the resistively switching material of the active organic layer undergoing a charge transfer in response to an application of an electric field is a material having conjugated main-chain as well as side-chain liquid crystalline polymers which can be aligned in mono-domain or multi-domain structures.

According to yet another embodiment the resistively switching material has the following formula without being restricted thereto:

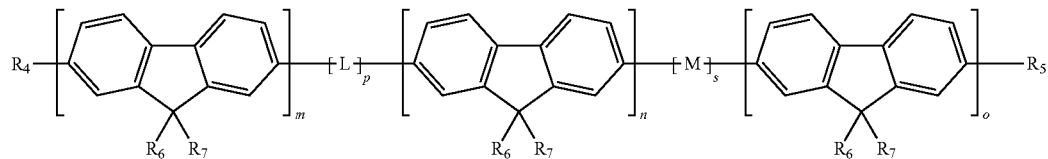

wherein R4 and R5 are independently at each occurrence selected from the group comprising:

R1 and R2 being independently selected from the group comprising straight chain $C_{1-20}$ alkyl, branched $C_{1-20}$ alkyl, aryl, substituted aryl, alkylaryl, substituted alkylaryl, alkoxyaryl, substituted alkoxyaryl, aryloxyaryl, substituted aryloxyaryl, dialkylaminoaryl, substituted dialkylaminoaryl, diarylaminoaryl and substituted diarylaminoaryl, R3 being selected from the group comprising straight chain $C_{1-20}$ alkyl, branched $C_{1-20}$ alkyl, aryl, substituted aryl, alkylaryl and substituted alkylaryl, and wherein R6 and R7 are independently at each occurrence selected from the group comprising straight chain $C_{1-20}$ alkyl, branched chain $C_{1-20}$ alkyl, aryl, substituted aryl, alkylaryl, substituted alkylaryl, —$(CH_2)_q$—$(O$—$CH_2$—$CH_2)_r$—$O$—$CH_3$, q being selected from the range $1<=q<=10$, r being selected from the range $0<=r<=20$, and wherein L and M are independently at each occurrence selected from the group comprising thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $m+n+o<=10$, each of m, n, o being independently selected from the range 1-1,000, and wherein p is selected from the range 0-15, and wherein s is selected from the range 0-15, with the proviso that, if R4 is H, R5 is not H, and if R5 is H, R4 is not H.

According to a further embodiment the resistively switching material of the active organic layer has the following formula without being restricted thereto:

wherein L independently at each occurrence is selected from the group consisting of thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $R_6$ and $R_7$ are independently at each occurrence selected from the group consisting of straight chain $C_{1-20}$, branched chain $C_{1-20}$ alkyl, aryl, substituted aryl alkylaryl, —$(CH_2)_q$—$(O$—$CH_2$—$CH_2)_r$—$O$—$CH_3$, q being selected from the range 1-10, r being selected from the range 0-20 and wherein R4 and R5 are independently at each occurrence selected from the group comprising:

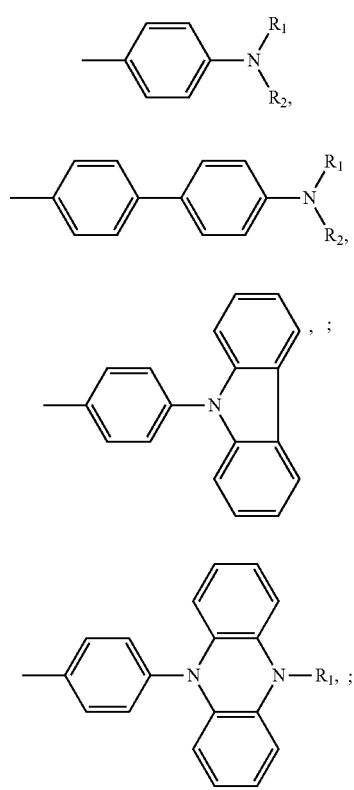
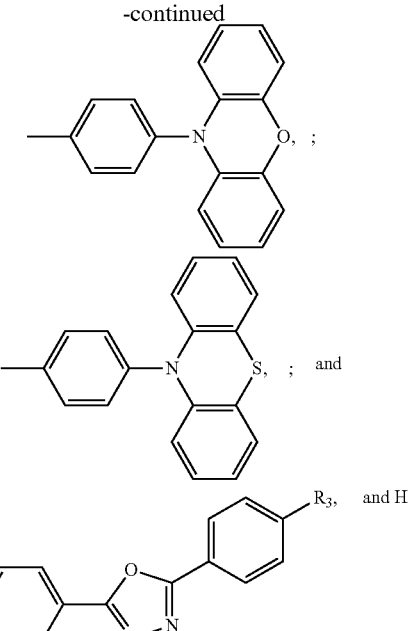
According to another embodiment the resistively switching material has one of the following formulas without being restricted thereto:
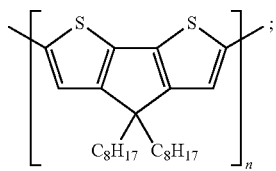
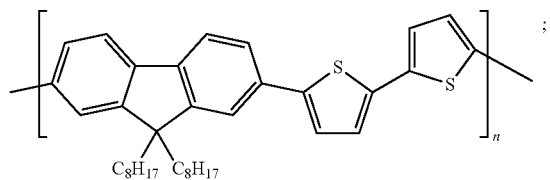
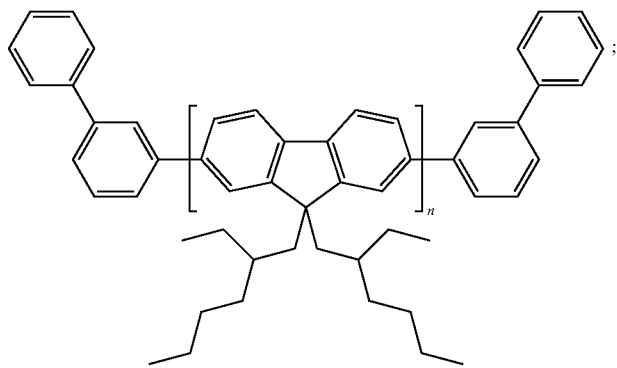

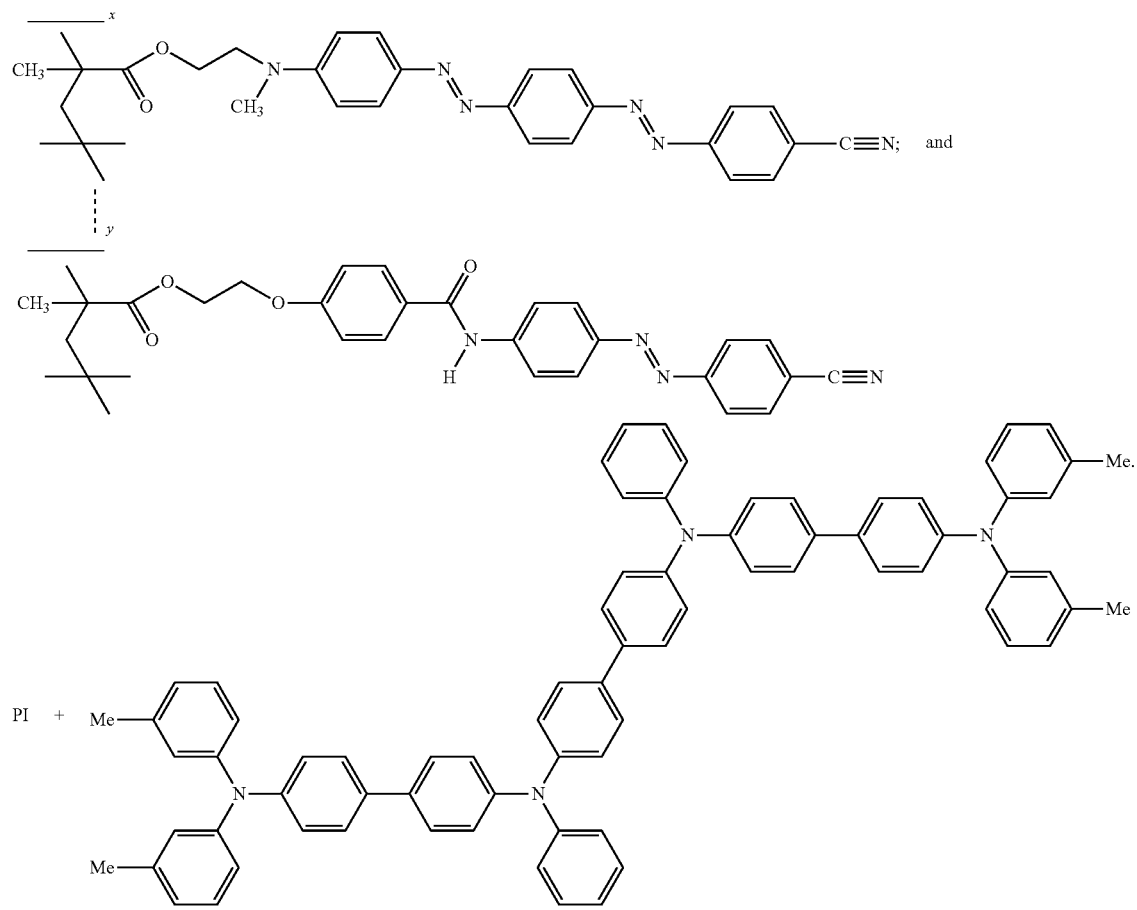

According to another embodiment the resistively switching material is an endcapped polyfluorene of the following formula without being restricted thereto:

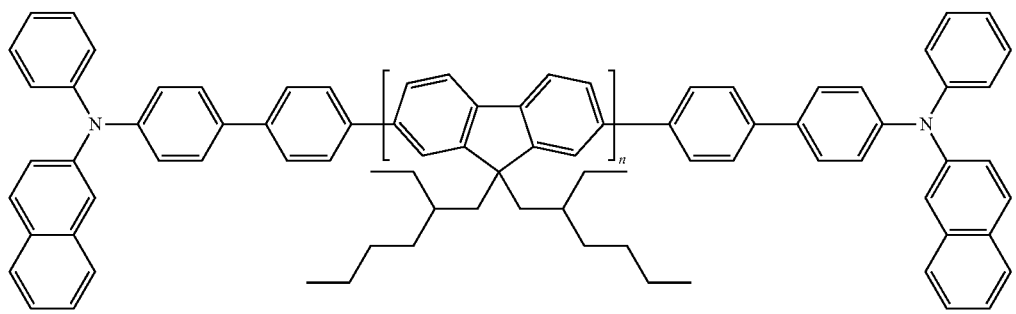

According to yet another embodiment the material is aligned on a substrate including a semiconductor stack by the use of alignment layers or by other methods such as direct mechanical rubbing, by using an electric field or magnetic field. The alignment results in dipole reorientation and a better charge transfer from the electrode or between the layer components.

For all resistively switching materials described above exhibiting a charge transfer in an electric field, the charge transfer may occur intramolecular or intermolecular to the molecules of the material. A charge transfer may also occur between a molecule and a connected electrode such as the gate electrode of a field effect transistor or contacts.

In an intramolecular charge transfer complex the donor and the acceptor moiety are part of the same molecule. The intramolecular charge transfer molecule can be a single molecule, an oligomer or polymer.

According to another embodiment the resistive switching material includes an electron poor molecule. Generally, electron poor molecules are molecules with electron withdrawing groups (with positive Hammett, δ, constant) and any electron donor groups and transition metal complexes with ligands having electron withdrawing groups directly attached to the metal. They can be single molecules, oligomers or polymers.

According to a further embodiment the electron poor molecules are defined by one of the following formulas without being restricted thereto:

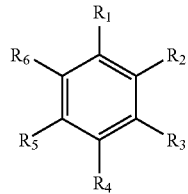

wherein R, $R_1$, $R_2$, $R_3$, $R_4$, $R_5$, $R_6$=C=O, COOH, F, Cl, Br, I, CN, $NO_2$, $NR_3^+$, O—Ar, COOR, OR, COR, SH, SR, $CONH_2$, CONHR, $CONR_2$, CHO, OH, $SO_2R$, $SO_2OR$, NO, C≡CR, Ar; and

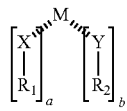

wherein M=transition metal, X, Y=electron withdrawing group like C=O, COOH, F, Cl, Br, I, CN, $NO_2$, $NR_3^+$, N=C, O—Ar, COOR, OR, COR, SH, SR, $CONH_2$, CONHR, $CONR_2$, CHO, C=N, OH, $SO_2R$, $SO_2OR$, NO, C≡CR, Ar and $R_1$, $R_2$=aromatic, allilylic; a, b=integer number.

According to yet another embodiment the electron poor molecule comprises one of the following formulas without being restricted thereto:

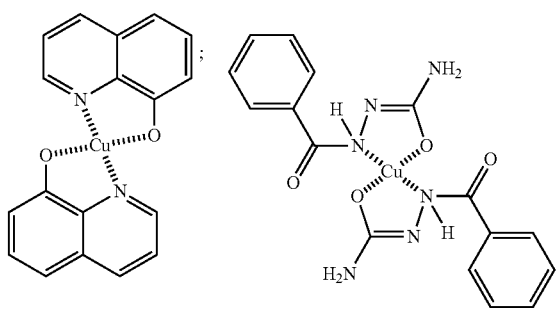

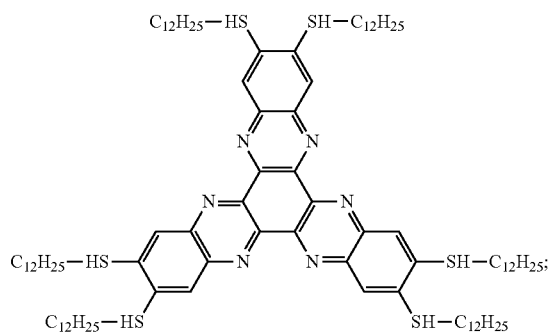

According to still a further embodiment the resistively switching material comprises a Redox-addressable molecule. Generally, redox addressable molecules are molecules in which the conjugation length and with it the conductivity changes upon chemical reduction or oxidation. They can be single molecules, oligomers or polymers. A typical redox addressable group are the 4,4' bipyridinium salts.

According to one embodiment the Redox-addressable molecules are defined by the formula without being restricted thereto:

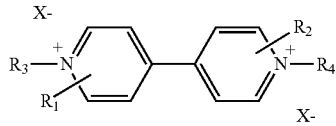

wherein $R_1$, $R_2$, $R_3$, $R_4$=aryl or alkyl $X^-$=anion.

According to an embodiment the Redox-addressable molecule comprises one of the formulas without being restricted thereto:

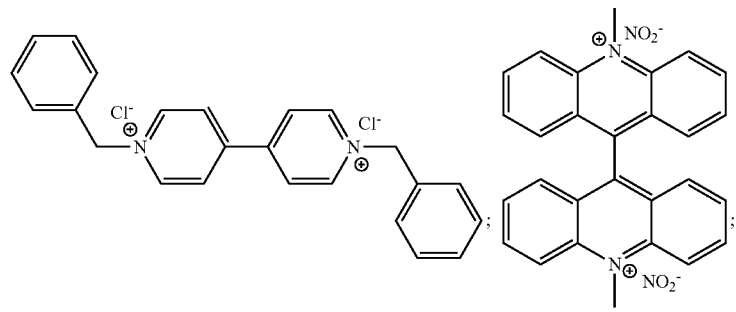
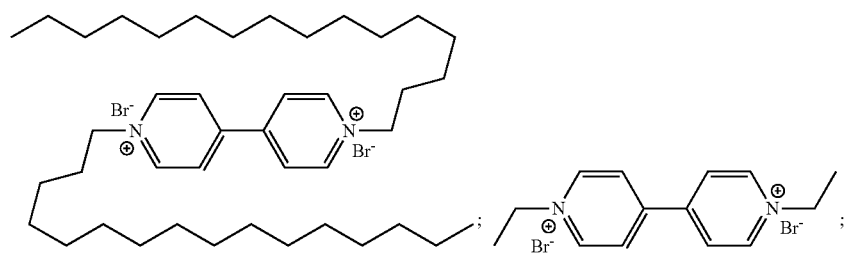
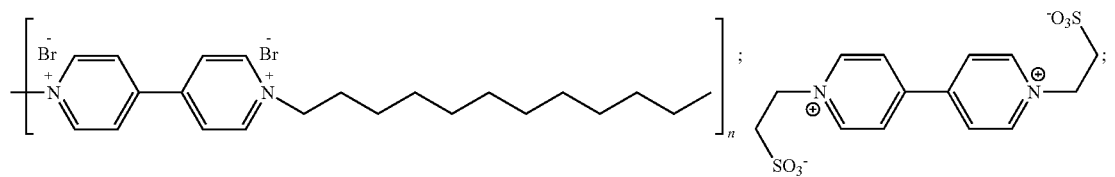
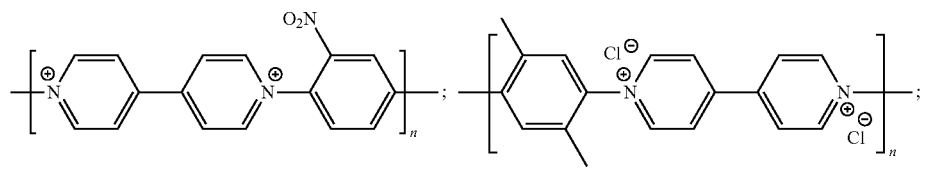
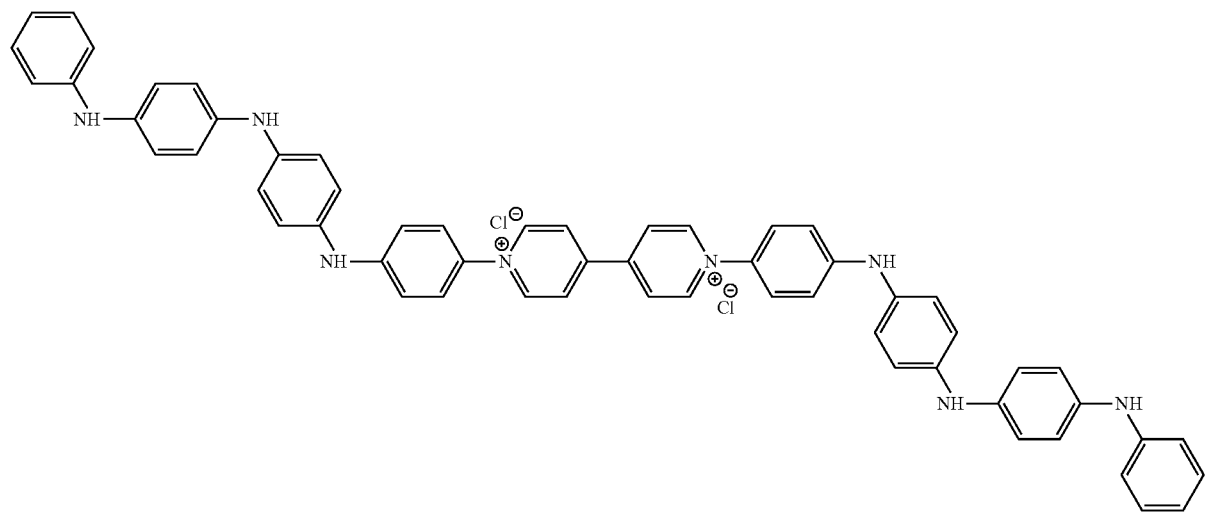

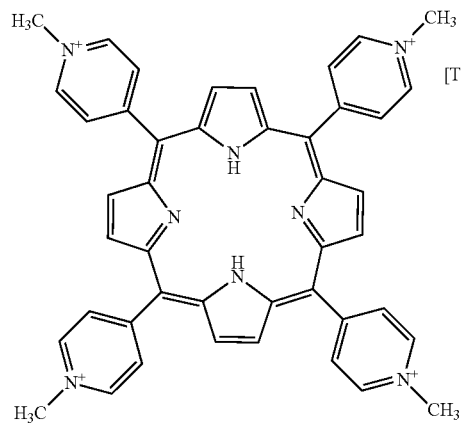

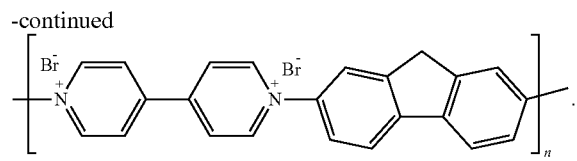

The layer of resistive switching material is usually amorphous and can easily be deposited on top of a substrate by using conventional deposition methods such as thermal evaporation, sputtering or spin-coating, by layer by layer deposition, electrostatic self-assembly and Langmuir Blodgett technique etc.

According to another embodiment a specific example of a material comprising electron poor molecules are active films of hexaazatrinaphthylene (HATNA) prepared by spin coating of a chloroform solution. The films can be dried under vacuum conditions. Then Aluminium electrodes may be deposited to form a complete switch.

Under application of a voltage profile an ON-OFF ratio of 2.3 within 20 cycles could be measured in an experimental setup.

In a redox addressable molecule the injection of electrons by an electric current chemically reduces the molecule and the increased amount of electrons in the π*orbitals increases the conductivity of the material which is transferred from a low conduction state (OFF) to a high conduction state (ON).

According to still another embodiment a resistively switching material includes a layer of Redox-addressable octadecyl viologen dibromide prepared for example by the Langmuir Blodgett technique, a layer of Redox-addressable poly(viologen-co-dodecane) prepared by spin coating of a chloroform/ethanol solution; and a layer of Redox-addressable 1,1'-diethyl-4,4' bipyridinium dibromide prepared by evaporation. Of course these materials can also be prepared with a technique that was indicated in relation with another material.

Further details with respect to materials that can be used as a resistively switching material and their preparation are disclosed in the European patent application EP 07 01 57 11 that is hereby incorporated by reference.

As the main characteristic a resistively switching material layer comprises two stable states which differ in the resistance of the layer: A low resistive ("ON") state and a high resistive ("OFF") state. By applying a positive or a negative voltage pulse, it is possible to switch between these states. The state of the switching material layer is stored even if no voltage is applied to the switching material layer.

In the case of a charge transfer complex material the process of a conductivity change between the components of the charge transfer complex upon application of an electric field can be explained as follows on a molecular scale: In a low-conductivity state, which can be considered as the "off" state, charge carriers such as electrons occupy the lowest energy levels. Due to an application of an electric field such as a voltage pulse electrons are transferred from a donor molecule to an acceptor molecule. As a result, charge carriers occupy higher energy levels. Thus the material is in a state of high conductivity or "on" state.

According to another embodiment a conductive polymer is a polymer of the group including poly(3,4-ethylenedioxythiophene) poly(styrenesulfonate) PEDOT:PSS, doped polyanilines without being restricted thereto.

The device may include additional layers not described so far. In particular, one or several material layers may be provided between the substrate and the dielectric layer, between the substrate and the first layer of organic material, between the dielectric layer and the first layer of organic material, or between the first layer of organic material and the protective second layer.

Figure 1B:
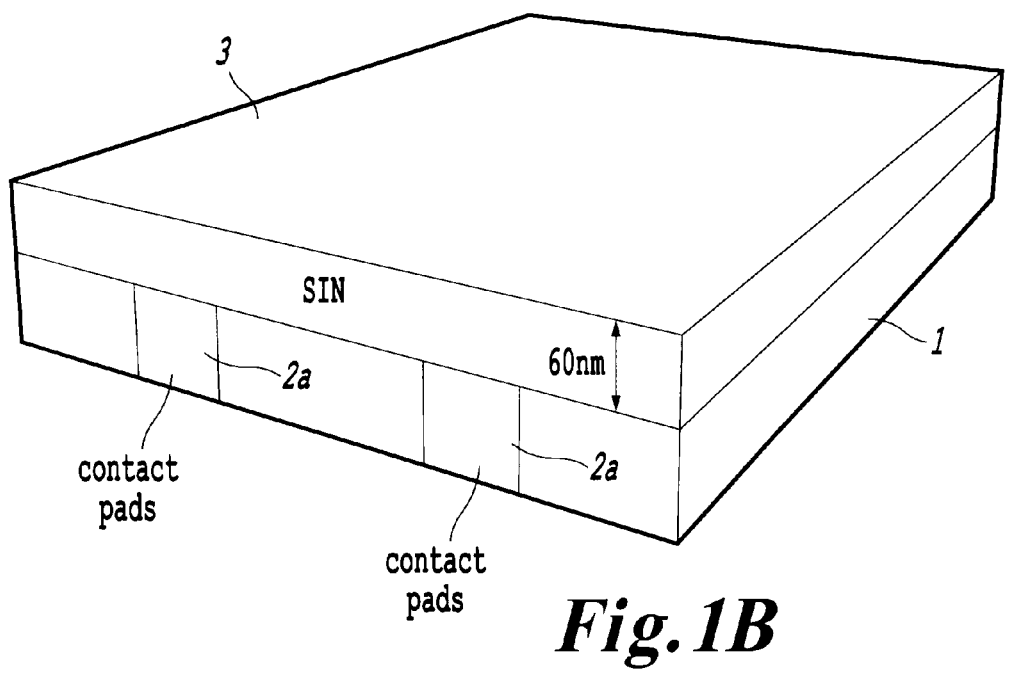
Figure 1C:
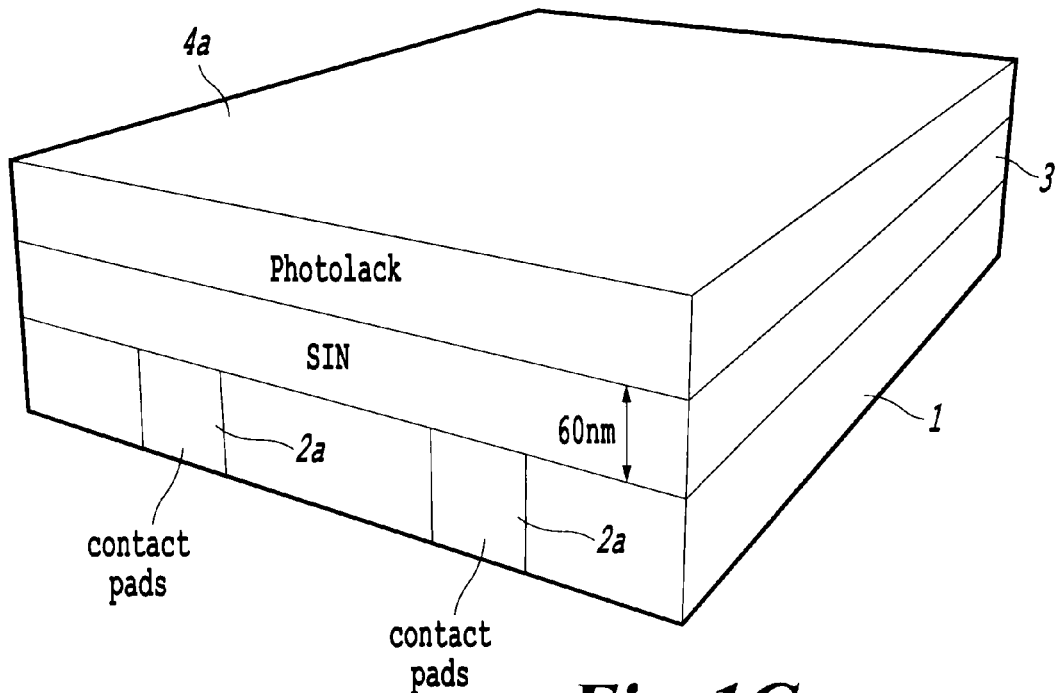
Figure 1D:
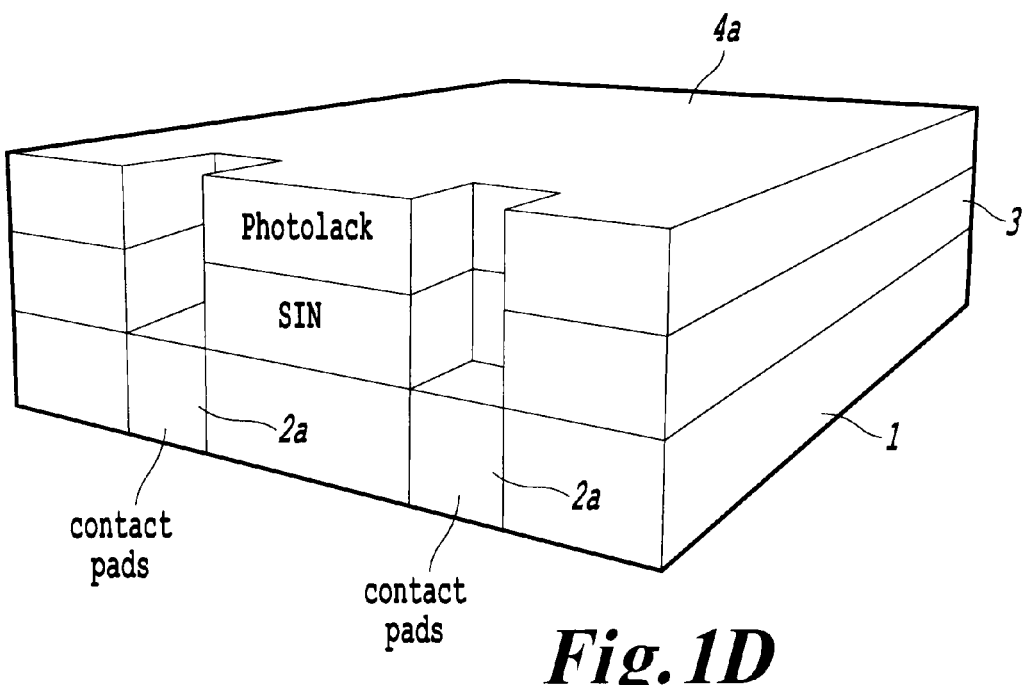
Figure 1E:
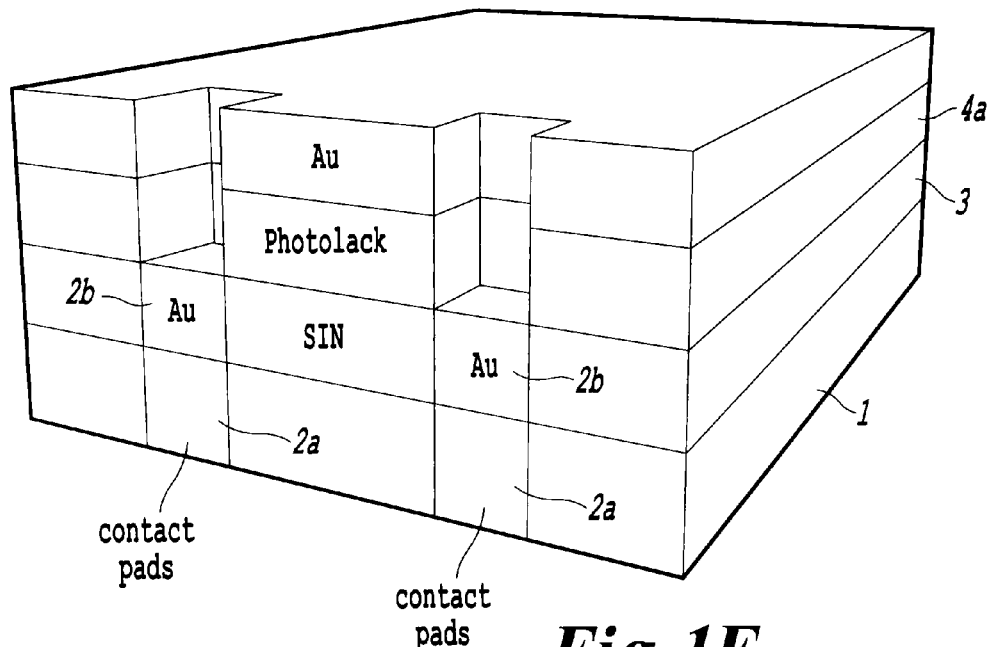
Figure 1F:
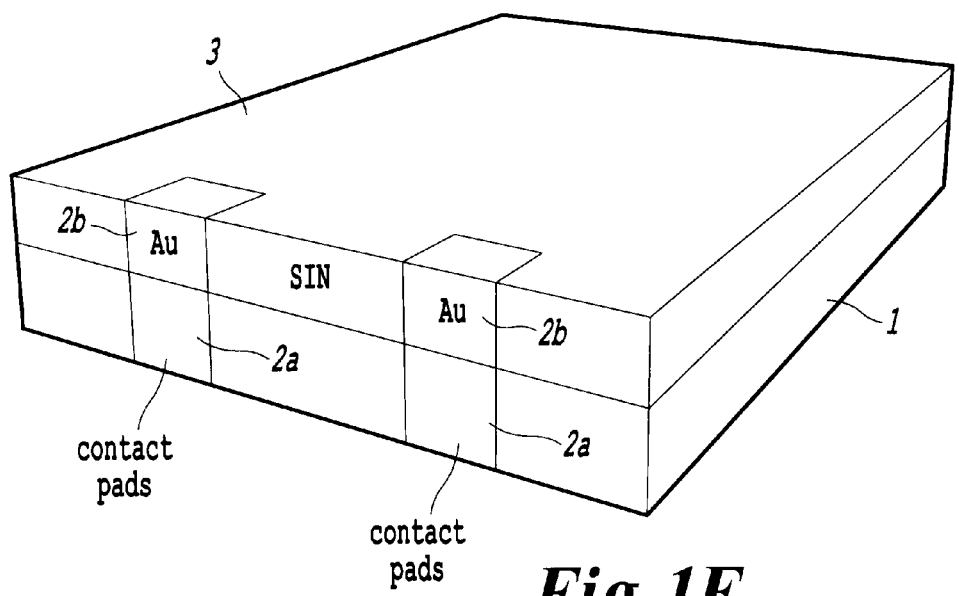
Figure 1G:
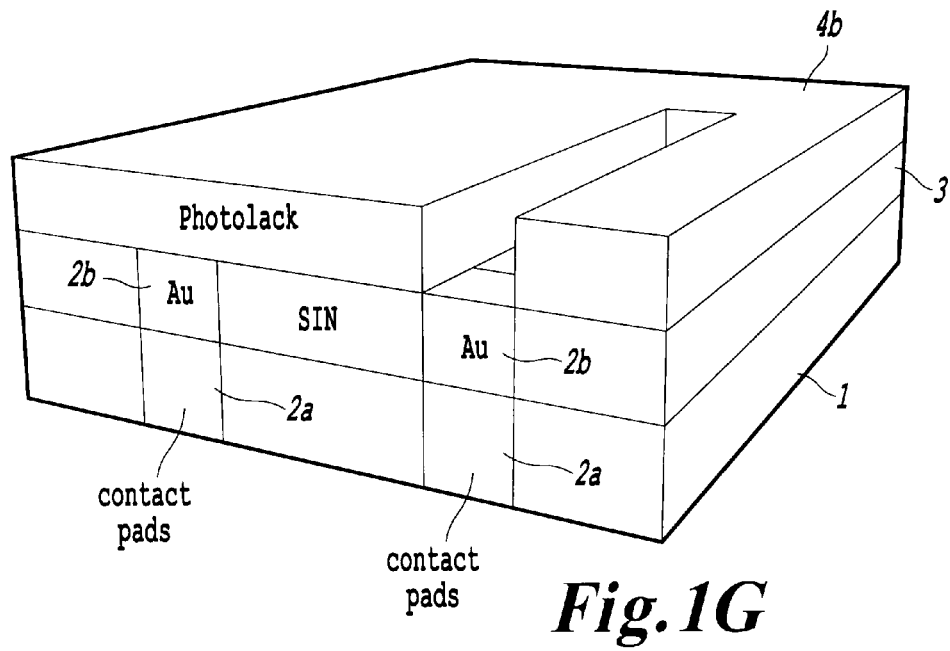
Figure 1H:
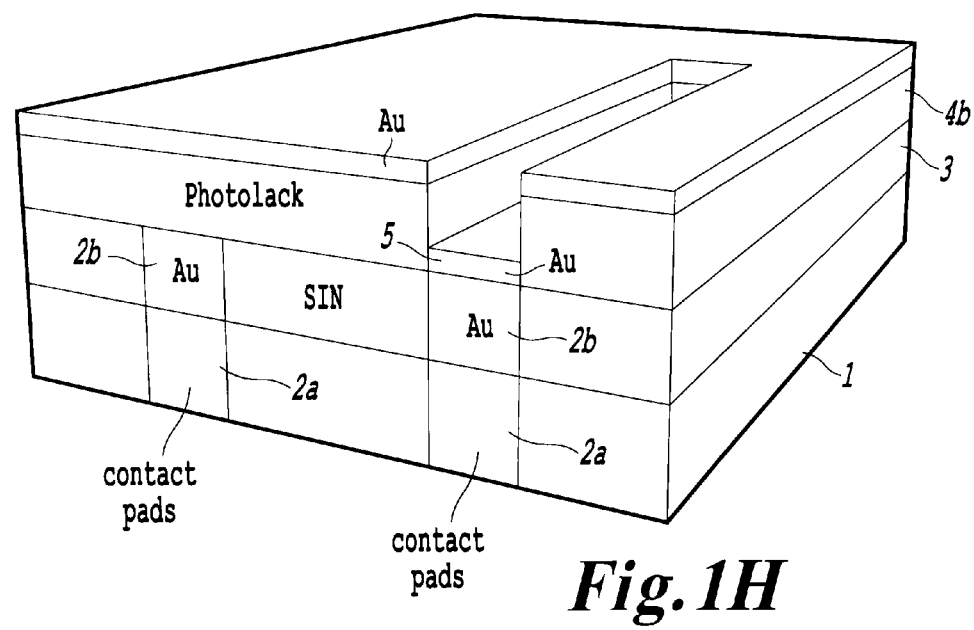
Figure 1I:
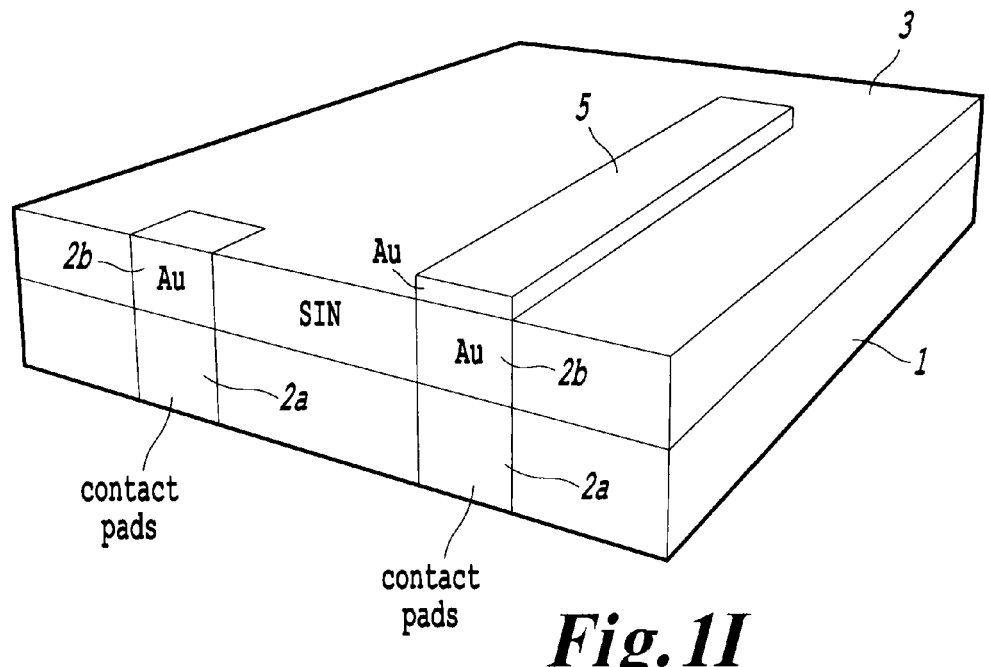
Figure 1J:
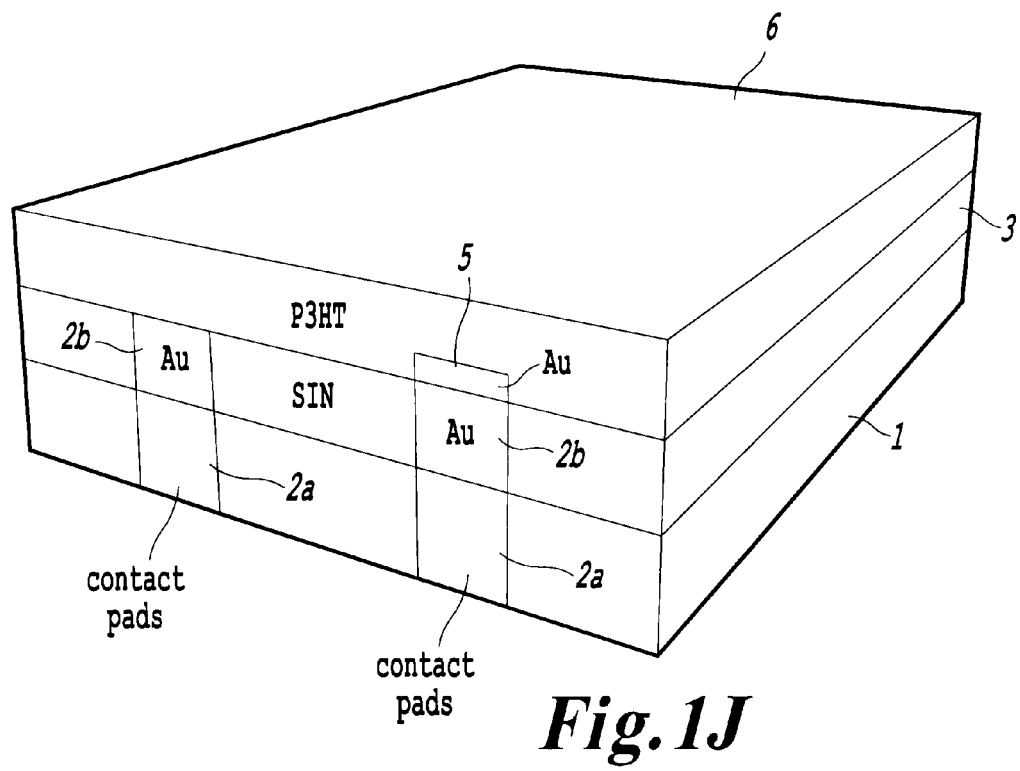
Figure 1K:
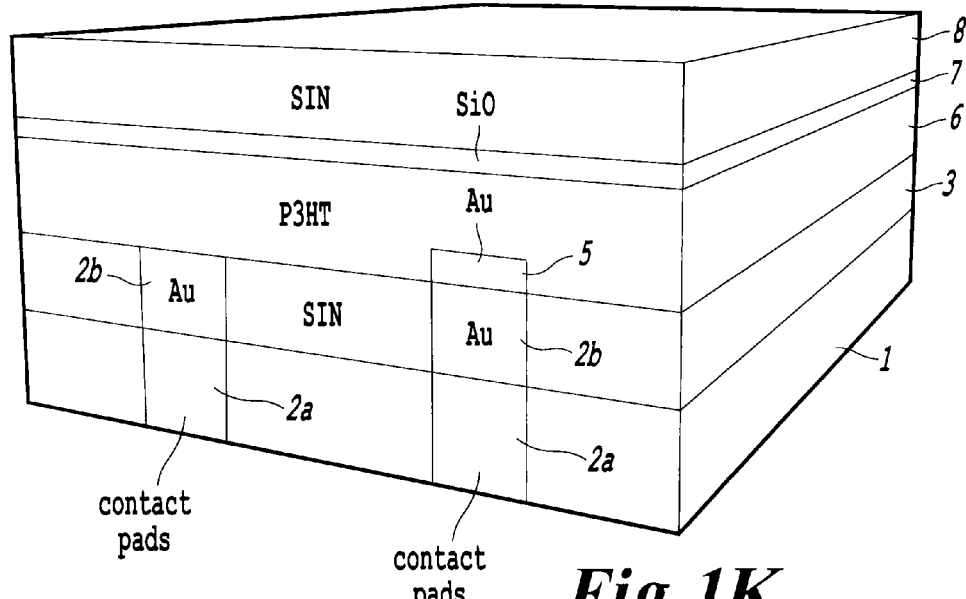
Figure 1L:
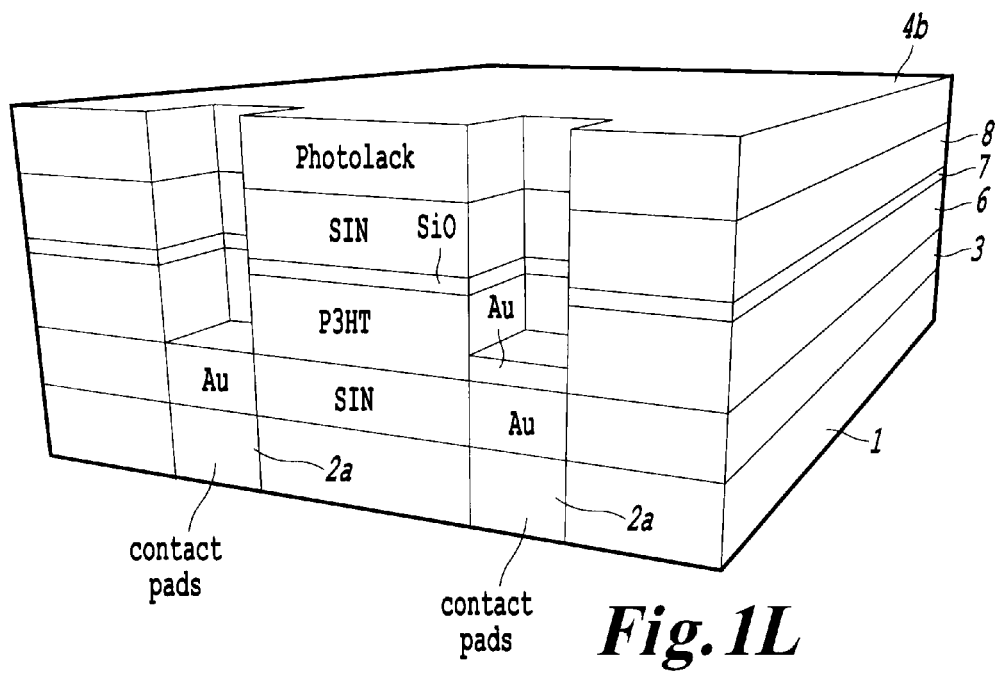
Figure 1M:
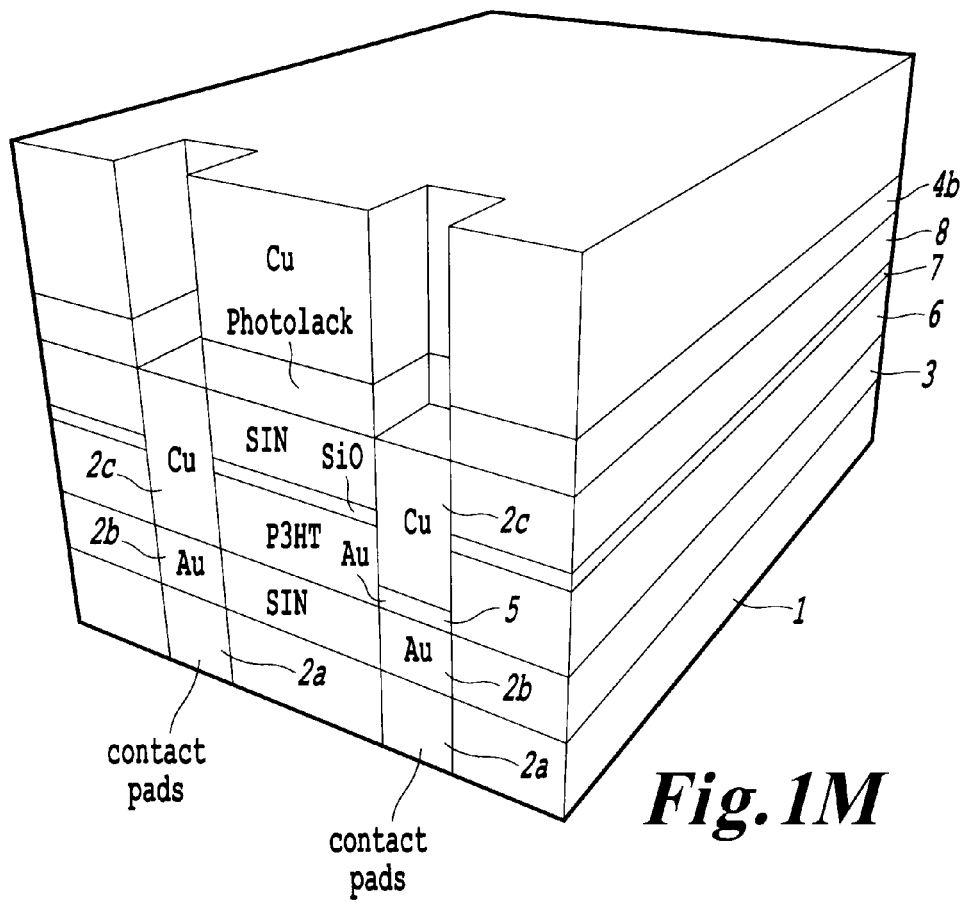
Figure 1N:
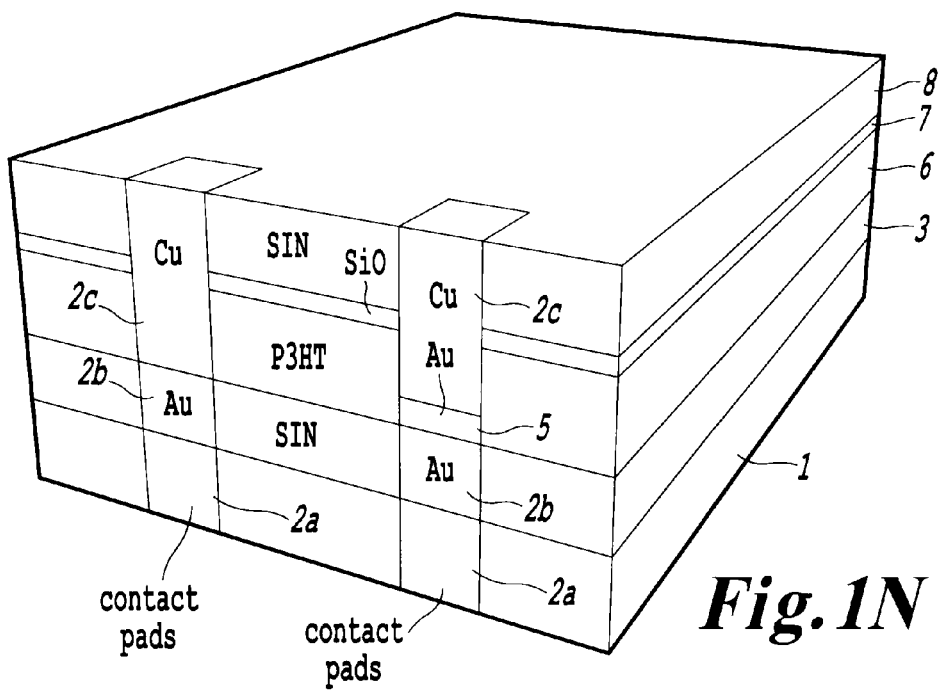
Figure 10:
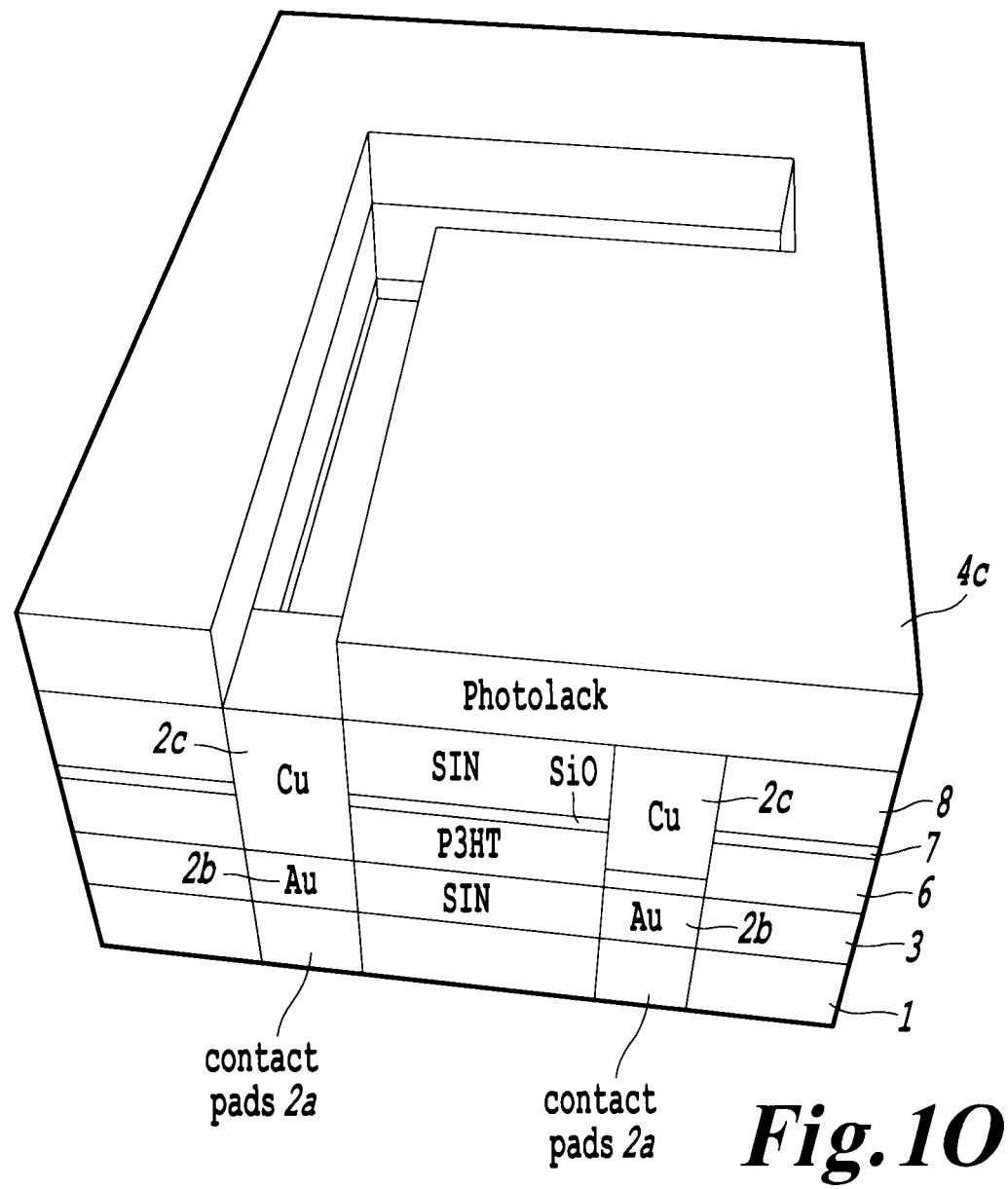
Figure 1P:
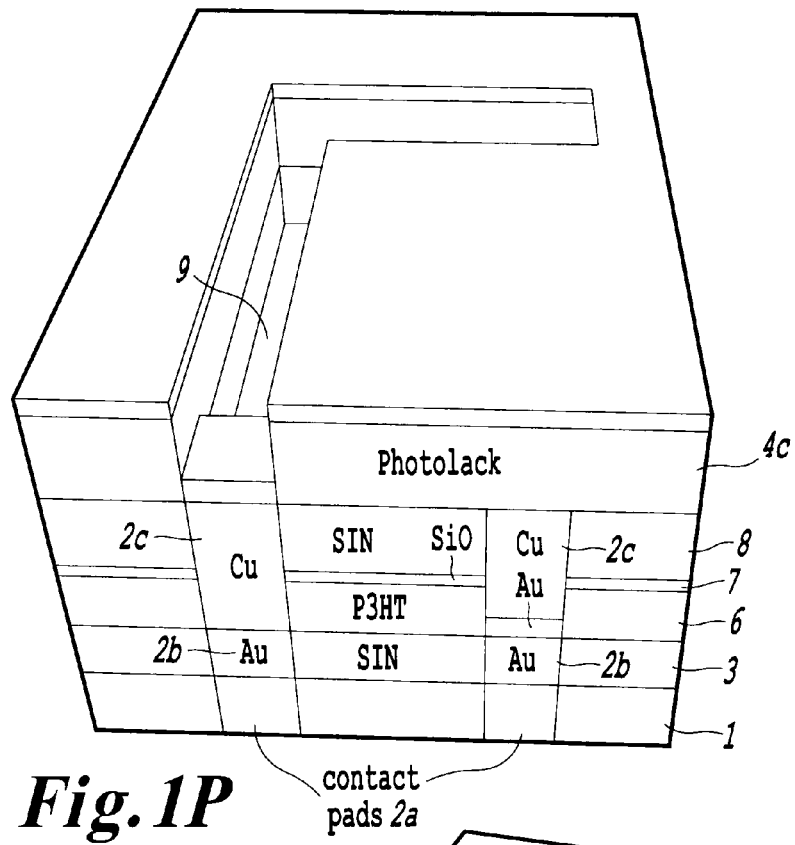
Figure 1Q:
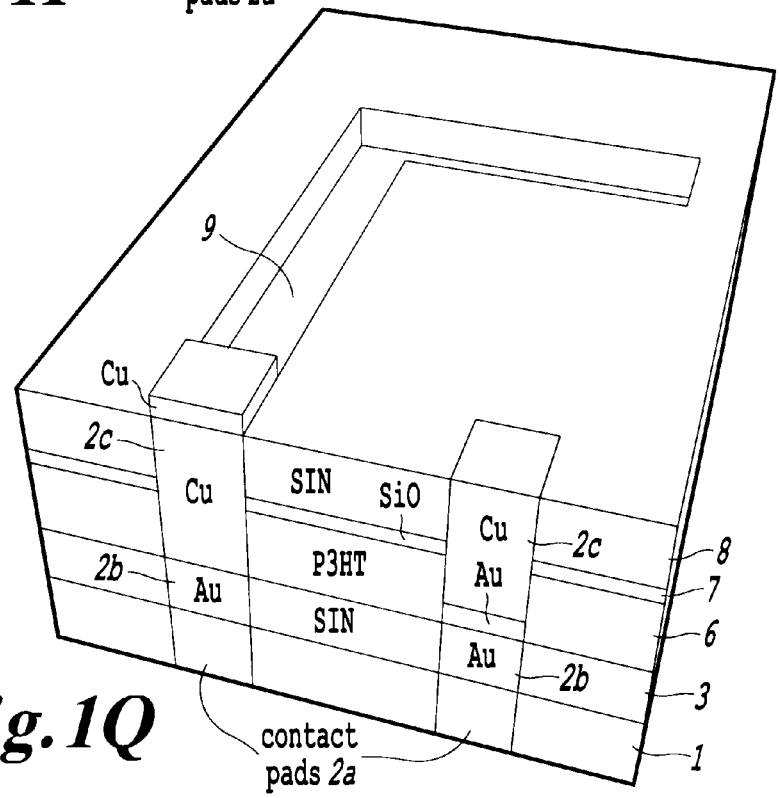
Figure 2:
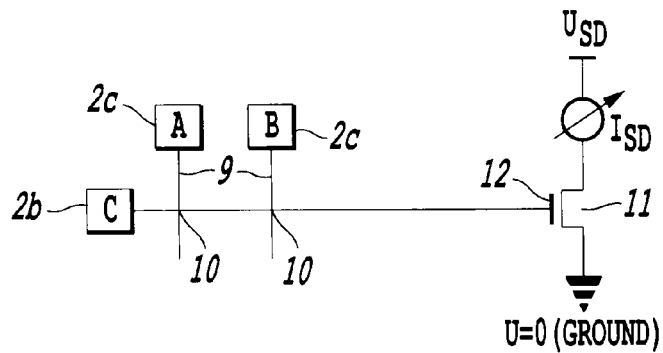

Further features, advantages and characteristics of the invention will result from the following description of a particular embodiment of the invention in combination with the appended drawing in which:

FIG. 1A-Q schematically illustrates semiconductor manufacturing steps of the hybrid electronic device according to one embodiment of the invention;

FIG. 2 schematically illustrates the layout of a fabricated device; and

FIG. 3 A-C shows I-V curves of the polymer-switch and of the corresponding transistor-readout performed via the Source/Drain voltage.

An exemplifying embodiment of the invention will be described with reference to schematic FIGS. 1A-1Q and 2. FIG. 1A shows a sample 1 representing the top most layer of a semiconductor stack such as a CMOS transistor stack including a MOSFET transistor. The patterned substrate 1 comprises the contact pads 2a to the transistor of the semiconductor stack. Subsequently, on top of the substrate 1 a first material layer 3 of silicon nitride (SiN) is deposited by a suitable deposition technique such as sputtering or PECVD (FIG. 1B).

On top of the first material layer 3 of silicon nitride (SiN) a photoresist 4a is spin-on and dried (FIG. 1c). Subsequently, the photoresist 4a is patterned by exposing the photoresist 4a through a mask (not shown) to a UV source. Subsequently, the positive photoresist 4a is developed and is lift off at the locations that have been exposed to UV light. Alternatively, a negative photoresist can be used. During an etch step the first material layer 3 is then etched at the locations not covered by photoresist 4*a* down to the contact pads 2*a* as shown in FIG. 1D. Then Au contacts 2*b* are deposited using the photoresist 4*a* as a mask (FIG. 1E).

As a further step the remaining photoresist 4*a* is removed together with the Au-layer deposited thereon (FIG. 1F). Subsequently, a new layer of photoresist 4*b* is spin on the substrate. This layer of photoresist 4*b* is subsequently patterned by exposure to UV radiation through a photolithographic mask (not shown) to comprise a bar or channel extending from one of the Au contacts 2*b* as is shown in FIG. 1G. A metallic bar 5 of Au is then deposited through the patterned photoresist 4*b* on the first material layer 3 of silicon nitride (SiN) and on one of the Au contacts 2*b* (FIG. 1H). Hence a bottom electrode is formed.

After removing the photoresist 4*b* mask (FIG. 1I), an active organic material layer 6 of e.g. poly(3-hexylthiophene), P3HT is deposited using a spin-casting technique (FIG. 1J). On top of the active organic material layer 6*a* dielectric layer 7 of silicon oxide (SiO) is deposited using a deposition process without a plasma. Such a process can be an evaporation process or an electrochemical deposition process. On top of the layer 7 of silicon oxide a further layer 8 of a dielectric material such as silicon nitride ($Si_3N_4$) is deposited.

The silicon oxide layer 7 and the silicon nitride layer 8 deposited on the active organic material layer 6 as well as the first material layer 3 serve as insulating barrier layers for the active organic material layer 6 that is sandwiched between them. In addition the silicon oxide layer 7 and the silicon nitride layer 8 deposited on the active organic material layer 6 are used as a double-layer hard mask for a subsequent process of depositing contacts and a top electrode.

While the silicon oxide layer 7 is evaporated, the $Si_3N_4$ silicon nitride is deposited by sputtering or PECVD. Hence, the SiO layer protects the active organic material layer 6 against detrimental effects of the sputtering process.

After etching the silicon nitride layer 8, the silicon oxide layer 7 and the active organic material 6 layer through a patterned further photoresist mask layer 4*c* on top of the silicon nitride layer 8 (FIG. 1L), Cu contacts 2*c* are deposited on top of Au contacts 2*b* (FIG. 1M).

Subsequently, the photoresist layer 4*b* and the Cu-material deposited on top of the photoresist layer 4*b* are removed (FIG. 1N). A further layer of photoresist 4*c* is spin on the top layer 8 of silicon nitride and exposed through a photolithographic mask (not shown) to UV radiation. The photolithographic mask comprises an L-shaped feature that is transferred to the silicon nitride layer 8 and the silicon oxide layer 7 in a subsequent etching step using the patterned photoresist layer 4*c* as a mask (FIG. 1O). A deposition of an L-shaped bar 9 of Cu on the active organic material layer 6 exposed in the previous etching follows (FIG. 1P) to form a top electrode. Finally, the photoresist layer 4*c* is stripped off. The endpoints of the Au bar 5 and the L-shaped bar 9 of Cu are positioned above each other and define a resistive switch 10 in their overlapping portion. The resistive switch 10 can be switched by applying a voltage or voltage pulse or a current or current pulse to the bars.

In the following exemplifying process parameters for the above described fabrication process are listed.

EXAMPLE

Fabricating of a molecular switch on top of a CMOS chip.
1. Cleaning chip for 15 min in acetone & 2 min in acetone including ultrasonic & 2 min in isopropanol (IPA) including ultrasonic
2. Sputtering of $Si_3N_4$: (60 nm: 500 W for 20 min; process pressure: 1.9E-2 mbar)
3. Lithography of $Si_3N_4$:
   i. Spin-on of AZ-nlof: 5 sec@1000 RPM & 30 sec@4000 RPM
   ii. Hardbake: 2 min@110° C.
   iii. Exposure: 6.5 sec
   iv. PEB: 1 min@105° C.
   v. Development of photoresist: 110 sec in MIF726+stop bath ($dH_2O$)
   vi. Etching of $Si_3N_4$ for contact holes:
      RIE: 20 sccm $CF_4$; 20 sccm $CHF_3$; 300 Watt; 30 mTorr; 80 sec
   vii. Evaporating of Cr/Au: 5 nmCr/35 nmAu @2 A/sec @4e-6 mbar
   viii. Lift-Off: in acetone overnight+short ultrasonic & IPA+short ultrasonic
4. Lithography of bottom electrodes:
   i. Spin-on von AZ-nlof: 5 sec@1000 RPM & 30 sec@4000 RPM
   ii. Hardbake: 2 min@110° C.
   iii. Exposure: 6.5 sec
   iv. PEB: 1 min@105° C.
   v. Development of photoresist: 110 sec in MIF726+stop bath ($dH_2O$)
   vi. Evaporating of bottom electrodes: 5 nm Ti @ 3 A/sec and 35 nm Au@ 3 A/sec @6.8E-6 mbar base pressure
   vii. Lift-off: in acetone for 30 min+ultrasonic & IPA (2 min@50% ultrasonic)
5. Spin-On P3HT regiorandom (ca 140 nm)
6. Depositing 15 nm of SiO@ 2 A/s @6.3e-6 mbar
7. Sputtering of 35 nm of SiN (500 W for 15 min; process pressure:1.9E-2 mbar)
8. Lithography of lead-throughs:
   i. Spin-on of AZ-nlof: 5 sec@1000 RPM & 30 sec@4000 RPM
   ii. Hardbake: 2 min@110° C.
   iii. Exposure: 6.5 sec
   iv. PEB: 1 min@105° C.
   v. Etch of $Si_3N_4$ & SiO & P3HT in RIE:
      a) $Si_3N_4$: 3 sccm $O_2$; 35 sccm $CF_4$; 200 Watt; 75 mTorr; 30 sec
      b) SiO: 20 sccm $CF_4$; 20 sccm $CHF_3$; 300 Watt; 30 mTorr; 20 sec
      c) P3HT: 20 sccm $O_2$; 30 Watt; 100 mTorr; 150 sec
   vi. Evaporation of 110 nm Cu@2 A/s @ 6e-6 mbar
   vii. Lift-off in acetone and rinse in IPA
9. Lithography of the top electrodes:
   i. Spin-on von AZ-nlof: 5 sec@1000 RPM & 30 sec@4000 RPM
   ii. Hardbake: 2 min@110° C.
   iii. Exposure: 6.5 sec Vacuum
   iv. PEB: 1 min@105° C.
   v. Etch of $Si_3N_4$ and SiO:
      a) $Si_3N_4$: 3 sccm $O_2$; 35 sccm $CF_4$; 200 Watt; 75 mTorr; 30 sec
      b) SiO: 20 sccm $CF_4$; 20 sccm $CHF_3$; 300 Watt; 30 mTorr; 20 sec
   vi. Evaporation of 50 nm Cu @ 2 A/sec @ 7e-7 mbar
   vii. Lift-off in acetone, rinse in IPA Electrical measurements were carried out with the fabricated device.

The measurements included a probing of the transistors 11 of the chip. Subsequently measurements of the resistive switches 10 were carried out. They showed that a switching from initial OFF state to ON state was possible. A reverse switching was observable as well. After the measurements of the resistive switch 10 which included an application of quite high voltages a measurement of one of the transistors showed no deterioration of its performance.

Then a combination of a polymeric resistive switch 10 and a transistor 11 was probed. The layout of a fabricated device is schematically shown in FIG. 2. The gate 12 of the transistor 11 was addressed via the Top Electrodes (TE) (2c) and via the corresponding polymer-switch 10, while the transistor-read-out was performed by measuring the Source/Drain current ($I_{SD}$) of the corresponding read-out transistor 11 as a function of the voltage ($V_G$) applied to the corresponding Top electrode (2c) at fixed Source/Drain voltages ($V_{SD}$).

In the above example the resistive switch 11 that was probed was initially in the OFF state. The OFF state leads to minimal ($I_{SD}$=180nA @ $V_{SD}$=2V and $V_G$=2V) transistor response, as expected. The corresponding Read-out curves are shown in FIG. 3C ("Off-state" curves).

The resistive switch 11 was then turned into its ON-state by applying a voltage of 5V between its bottom contact 2b and top contact 2c. The corresponding I-V curve is shown in FIG. 3A. The following read-out via the transistor 11 showed a normal response ($I_{SD}$=1.7 mA @ $V_{SD}$=2V and $V_G$=2V) as is visible in the "On-state" curves in FIG. 3C.

Figure 3C:
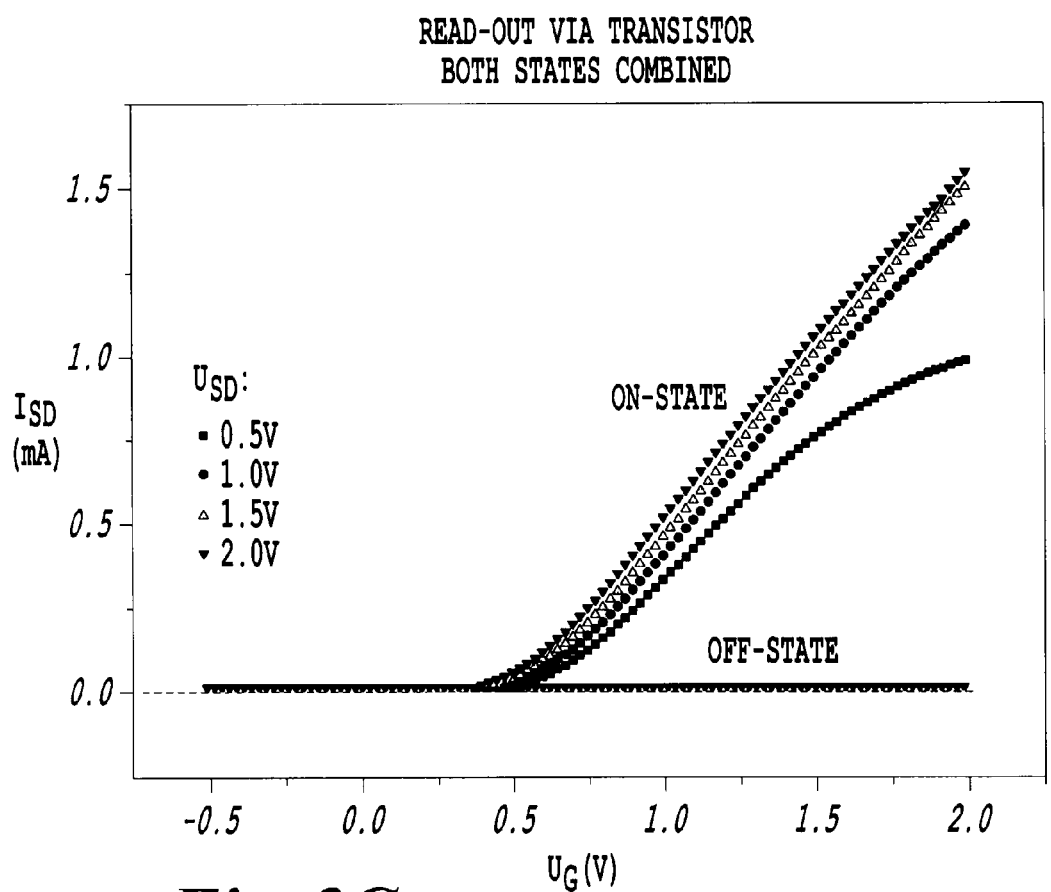
Figure 3A:
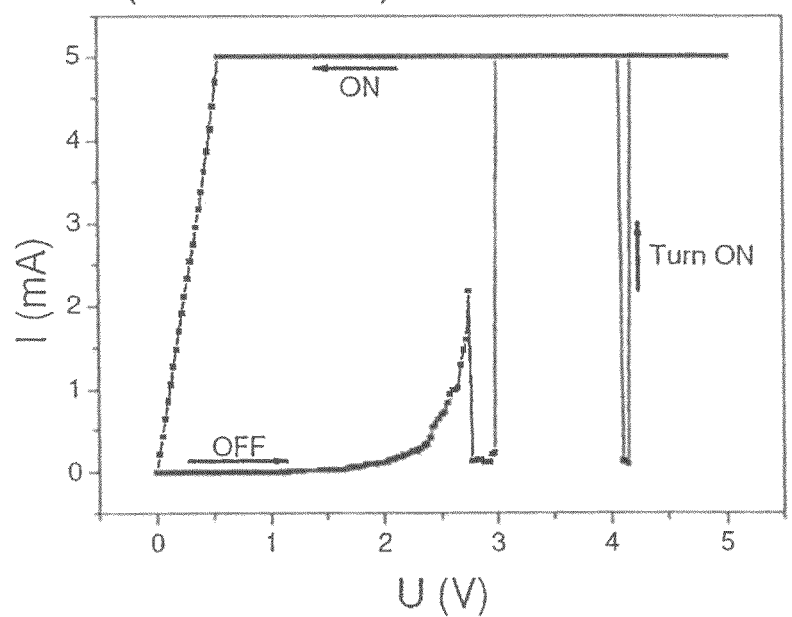
Figure 3B:
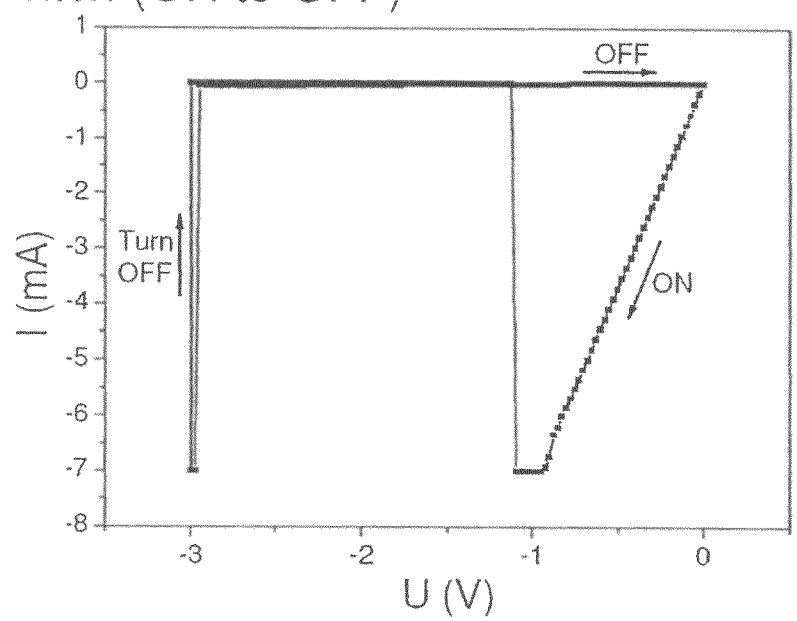

By applying a voltage of −3V to the resistive switch's top and bottom electrodes 2c, 2b the switch 11 was turned back to it's OFF-state again (FIG. 3B), resulting in the same minimal transistor response as is visible by the "Off-state" curves in FIG. 3C.

In summary, it was possible to repeatedly switch a resistive switch between its OFF and ON state (random access memory (RAM) behaviour). The transistor read-out changes accordingly.

The features of the invention as previously described may be of importance for the invention alone or in any combination.

REFERENCES

[1.] K. K. Likharev, D. B. Strukov, in *Introducing Molecular Electronics* 2007.

[2.] D. B. Strukov, K. K. Likharev, *Nanotechnology* 2005, 16 888-900.

[3.] G. S. Snider, R. S. Williams, *Nanotechnology* 2007, 18 035204.

The invention claimed is:

1. An electronic device comprising:
a substrate including a semiconductor device stack;
a first material layer over the substrate, the first material layer being an insulating layer;
an active organic material layer over the first material layer;
a second material layer over the active organic material layer, the second material layer being an insulating layer; and
a third material layer between the second material layer and the active organic material layer, the third material layer being an insulating layer, wherein the first material layer includes at least one bottom electrode for contacting the active organic material layer and the second material layer includes at least one top electrode for contacting the active organic material layer.

2. The electronic device according to claim 1, further comprising a horizontally extending metal bar connected to one of a bottom electrode and a top electrode.

3. The electronic device according to claim 1, wherein the semiconductor device stack comprises a CMOS device which includes a PMOS transistor and a NMOS transistor.

4. The electronic device according to claim 1, wherein the material of at least one of the first material layer and the second material layer is a dielectric material of one of silicon oxynitride ($Si_xON_y$) and $Si_3N_4$.

5. The electronic device according to claim 1, wherein the third material layer is a dielectric material of one of SiO, $SiO_2$, $Gd_2O_3$, $Y_2O_3$, $Al_2O_3$, $BaSrTiO_3$, $BaTiO_3$, and fluorides including $CaF_2$, LiF.

6. The electronic device according to claim 1, wherein the active organic layer is a layer of one of an organic semiconductor, a semiconductor p-n junction, a resistively switching material, a conductive polymer or a combination thereof.

7. A semiconductor device comprising:
a substrate including a semiconductor device stack;
a first material layer over the substrate, the first material layer being an insulating layer;
an active organic material layer over the first material layer;
a second material layer over the active organic material layer, the second material layer being an insulating layer; and
a horizontally extending metal bar connected to one of a bottom electrode and a top electrode.

8. The semiconductor device according to claim 7, wherein the first material layer includes at least one bottom electrode for contacting the active organic material layer and the second material layer includes at least one top electrode for contacting the active organic material layer.

9. The semiconductor device according to claim 7, further comprising a third material layer between the second material layer and the active organic material layer, the third material layer being an insulating layer.

10. The semiconductor device according to claim 7, wherein the semiconductor device stack comprises a CMOS device which includes a PMOS transistor and a NMOS transistor.

11. The semiconductor device according to claim 7, wherein the material of at least one of the first material layer and the second material layer is a dielectric material of one of silicon oxynitride ($Si_xON_y$) and $Si_3N_4$.

12. The semiconductor device according to claim 7, wherein the material of the third material layer is a dielectric material of one of SiO, $SiO_2$, $Gd_2O_3$, $Y_2O_3$, $Al_2O_3$, $BaSrTiO_3$, $BaTiO_3$, and fluorides including $CaF_2$, LiF.

13. The semiconductor device according to claim 7, wherein the active organic layer is a layer of one of an organic semiconductor, a semiconductor p-n junction, a resistively switching material, a conductive polymer or a combination thereof.

14. A semiconductor device comprising:
a substrate including a semiconductor device stack;
a first material layer over the substrate, the first material layer being an insulating layer;
an active organic material layer over the first material layer;
a second material layer over the active organic material layer, the second material layer being an insulating layer; and
a CMOS device included in the semiconductor device stack, wherein the CMOS device includes a PMOS transistor and a NMOS transistor.

15. The semiconductor device according to claim 14, wherein the first material layer includes at least one bottom electrode for contacting the active organic material layer and the second material layer includes at least one top electrode for contacting the active organic material layer.

16. The semiconductor device according to claim 14, further comprising a third material layer between the second material layer and the active organic material layer, the third material layer being an insulating layer.

17. The semiconductor device according to claim 14, further comprising a horizontally extending metal bar connected to one of the bottom electrode and top electrode.

18. The semiconductor device according to claim 14, wherein the material of at least one of the first material layer and the second material layer is a dielectric material of one of silicon oxynitride ($Si_xON_y$) and $Si_3N_4$.

19. The semiconductor device according to claim 14, wherein the material of the third material layer is a dielectric material of one of $SiO$, $SiO_2$, $Gd_2O_3$, $Y_2O_3$, $Al_2O_3$, $BaSrTiO_3$, $BaTiO_3$, and fluorides including $CaF_2$, $LiF$.

20. The semiconductor device according to claim 14, wherein the active organic layer is a layer of one of an organic semiconductor, a semiconductor p-n junction, a resistively switching material, a conductive polymer or a combination thereof.

* * * * *